(12) United States Patent
Sharps et al.

(10) Patent No.: US 7,785,989 B2
(45) Date of Patent: Aug. 31, 2010

(54) GROWTH SUBSTRATES FOR INVERTED METAMORPHIC MULTIJUNCTION SOLAR CELLS

(75) Inventors: Paul R. Sharps, Albuquerque, NM (US); Arthur Cornfeld, Sandia Park, NM (US); Tansen Varghese, Albuquerque, NM (US); Fred Newman, Albuquerque, NM (US); Jacqueline Diaz, Albuquerque, NM (US)

(73) Assignee: Emcore Solar Power, Inc., Albuquerque, NM (US)

( * ) Notice: Subject to any disclaimer, the term of this patent is extended or adjusted under 35 U.S.C. 154(b) by 30 days.

(21) Appl. No.: 12/337,014

(22) Filed: Dec. 17, 2008

(65) Prior Publication Data

US 2010/0151618 A1    Jun. 17, 2010

(51) Int. Cl.
   *H01L 21/30* (2006.01)
   *H01L 21/46* (2006.01)

(52) U.S. Cl. .................. 438/458; 438/464; 438/476; 438/604; 438/977; 257/E21.124; 257/E25.007

(58) Field of Classification Search .............. 438/458, 438/464, 476, 604, 977; 257/E27.124, E25.007
   See application file for complete search history.

(56) References Cited

U.S. PATENT DOCUMENTS

| | | | |
|---|---|---|---|
| 4,001,864 A | 1/1977 | Gibbons et al. | |
| 4,255,211 A | 3/1981 | Fraas | |
| 4,338,480 A | 7/1982 | Antypas et al. | |
| 4,612,408 A | 9/1986 | Moddel et al. | |
| 4,692,559 A * | 9/1987 | Ellion et al. | 136/262 |
| 5,019,177 A | 5/1991 | Wanlass | |
| 5,053,083 A | 10/1991 | Sinton et al. | |
| 5,217,539 A | 6/1993 | Fraas et al. | |
| 5,322,572 A | 6/1994 | Wanlass et al. | |
| 5,342,453 A | 8/1994 | Olson | |
| 5,376,185 A | 12/1994 | Wanlass | |
| 5,479,032 A | 12/1995 | Forrest et al. | |
| 5,944,913 A | 8/1999 | Hou et al. | |
| 6,180,432 B1 | 1/2001 | Freeouf | |

(Continued)

FOREIGN PATENT DOCUMENTS

| | | |
|---|---|---|
| EP | 0 658 944 B1 | 4/2009 |
| FR | 2 878 076 A1 | 5/2006 |
| WO | WO 2005/015638 A1 | 2/2005 |

OTHER PUBLICATIONS

R. Venkatasubramanian, et al., "An Inverted-Growth Approach to Development of an IR-Transparent, High-Efficiency AlGaAs/GaAs Cascade Solar Cell." $22^{nd}$ IEEE Photovoltaic Specialists Conference, Oct. 7-11, 1991, Las Vegas, NV, USA.

(Continued)

*Primary Examiner*—Michelle Estrada

(57) ABSTRACT

A method of manufacturing a solar cell by providing a gallium arsenide carrier with a prepared bonding surface; providing a sapphire substrate; bonding the gallium arsenide carrier and the sapphire substrate to produce a composite structure; detaching the bulk of the gallium arsenide carrier from the composite structure, leaving a gallium arsenide growth substrate on the sapphire substrate; and depositing a sequence of layers of semiconductor material forming a solar cell on the growth substrate. For some solar cells, the method further includes mounting a surrogate second substrate on top of the sequence of layers of semiconductor material forming a solar cell; and removing the growth substrate.

16 Claims, 33 Drawing Sheets

U.S. PATENT DOCUMENTS

| | | | |
|---|---|---|---|
| 6,239,354 | B1 | 5/2001 | Wanlass et al. |
| 6,252,287 | B1 | 6/2001 | Kurtz et al. |
| 6,281,426 | B1 | 8/2001 | Olson et al. |
| 6,300,557 | B1 | 10/2001 | Wanlass et al. |
| 6,300,558 | B1 | 10/2001 | Takamoto et al. |
| 6,340,788 | B1 | 1/2002 | King et al. |
| 6,482,672 | B1 | 11/2002 | Hoffman et al. |
| 6,660,928 | B1 | 12/2003 | Patton et al. |
| 6,951,819 | B2 | 10/2005 | Iles et al. |
| 7,071,407 | B2 | 7/2006 | Faterni et al. |
| 2002/0117675 | A1 | 8/2002 | Mascarenhas |
| 2003/0203547 | A1* | 10/2003 | Sakaguchi et al. ......... 438/151 |
| 2004/0200523 | A1 | 10/2004 | King et al. |
| 2006/0021565 | A1 | 2/2006 | Zahler et al. |
| 2006/0144435 | A1 | 7/2006 | Wanlass et al. |
| 2006/0162768 | A1 | 7/2006 | Wanlass et al. |
| 2007/0218649 | A1 | 9/2007 | Hernandez |
| 2007/0277873 | A1 | 12/2007 | Cornfeld et al. |
| 2007/0277874 | A1* | 12/2007 | Dawson-Elli et al. ....... 136/256 |
| 2008/0185038 | A1 | 8/2008 | Sharps |
| 2008/0245409 | A1 | 10/2008 | Varghese et al. |

OTHER PUBLICATIONS

M. Yamaguchi, "Physics and Technologies of Superhigh-Efficiency Tandem Solar Cells." vol. 33, No. 9, Sep. 1999, pp. 961-964. Toyota Technological Institute, Nagoya, Japan. © 1999, American Institute of Physics.

R.R. King et al., "Next-Generation, High-Efficiency III-V Multijunction Solar Cells." 28th IEEE Photovoltaic Specialists Conference, Sep. 15-22, 2000, Anchorage, AK, USA.

S. Sinharoy, et al., "Progress in the Development of Metamorphic Multi-junction III-V Space Solar Cells." Progress in Photovoltaics: Research and Applications, vol. 10, Feb. 2002, pp. 427-432. John Wiley & Sons, Ltd. Hoboken, NJ, USA.

R.R. King, et al., "High Efficiency Space and Terrestrial Multijunction Solar Cells Through Bandgap Control in Cell Structures." 2002 Photovoltaic Specialists Conference, Conference Record of the 29th IEEE, May 19-24, 2002, pp. 776-781. New Orleans, LA, USA.

M.W. Wanlass et al., "Lattice-Mismatched Approaches for High-Performance, III-V Photovoltaic Energy Converters." Proceedings of the 31st IEEE PVSC, Jan. 3-7, 2005, Lake Buena Vista, FL, USA.

Takamoto, T., et al., "InGaP/GaAs-based Multijunction Solar Cells." Progress in Photovoltaics: Research and Applications, 2005; vol. 13, pp. 495-511. Wiley InterScience, John Wiley & Sons, Ltd., Hoboken, NJ.

M.W. Wanlass et al., "Monolithic, Ultra-Thin GaInP/GaAs/GaInAs Tandem Solar Cells." 2006 IEEE 4th World Conference on Photovoltaic Energy Conversion, May 7-12, 2006, Waikoloa, Hawaii, USA.

D.J. Friedman, et al., "0.7-eV GaInAs Junction for a GaInP/GaAs/GaInAs(1eV)/GaInAs(0.7eV) Four-Junction Solar Cell." 2006 IEEE 4th World Conference on Photovoltaic Energy Conversion, May 7-12, 2006, Waikoloa, Hawaii, USA.

J.F. Geisz, et al., "High-efficiency GaInP/GaAs/InGaAs triple-junction solar cells grown inverted with a metamorphic bottom junction." Applied Physics Letters 91, 023502 (2007), pp. 023502-1-023502-3. Online publication Jul. 10, 2007. American Institute of Physics, Melville, NY, USA.

P. Sharps, et al., "Inverting the triple junction improves efficiency and flexibility." Compound Semiconductor. Oct. 2007, pp. 25-28. IOP Publishing, Ltd., Bristol, England.

H. Yoon, et al., "Progress of Inverted Metamorphic III-V Solar Cell Development at Spectrolab." 33rd IEEE Photovoltaic Specialists Conference, May 11-16, 2008, San Diego, CA, USA.

J.F. Geisz, et al., "Inverted GaInP / (In)GaAs / InGaAs Triple-Junction Solar Cells with Low-Stress Metamorphic Bottom Junctions." 33rd IEEE Photovoltaic Specialists Conference, May 11-16, 2008, San Diego, CA, USA.

A. Cornfeld, et al., "Development of a Large Area Inverted Metamorphic Multi-junction (IMM) Highly Efficient AM0 Solar Cell." 33rd IEEE Photovoltaic Specialists Conference, May 11-16, 2008, San Diego, CA, USA.

A. Cornfeld, et al., "Development of a Large Area Inverted Metamorphic Multi-junction Highly Efficient AM0 Solar Cell." Conference paper presented at the 33rd IEEE Photovoltaic Specialists Conference (May 11-16, 2008) on May 12, 2008. San Diego, CA, USA, 17 pages.

M. Stan, et al., "Very High Efficiency Triple Junction Solar Cells by MOVPE." 14th International Conference of Metalorganic Vapor Phase Epitaxy. Jun. 1-6, 2008, Metz, France.

A. Cornfeld, et al., "Advances in the Performance of Inverted Metamorphic Multi-junction Solar Cells." 23rd European Photovoltaic Energy Conference. Sep. 1-5, 2008, Valencia, Spain.

"Partial European Search Report," Application No. EP 08 01 3466. Feb. 12, 2009. European Patent Office, Berlin, Germany.

P. Wurfel. Physics of Solar Cells: from Basic Principles to Advanced Concepts. 2nd, Updated and Expanded Edition. 2009. Sections 6.4, 6.5 and 6.8. 20 pages. Wiley-VCH, Weinheim, Germany.

* cited by examiner

GROWTH SUBSTRATES FOR INVERTED METAMORPHIC MULTIJUNCTION SOLAR CELLS

REFERENCE TO RELATED APPLICATIONS

This application is related to co-pending U.S. patent application Ser. No. 12/271,127 and Ser. No. 12/271,192 filed Nov. 14, 2008.

This application is related to co-pending U.S. patent application Ser. No. 12/267,812 filed Nov. 10, 2008.

This application is related to co-pending U.S. patent application Ser. No. 12/258,190 filed Oct. 24, 2008.

This application is related to co-pending U.S. patent application Ser. No. 12/253,051 filed Oct. 16, 2008.

This application is related to co-pending U.S. patent application Ser. No. 12/190,449 filed Aug. 12, 2008.

This application is related to co-pending U.S. patent application Ser. No. 12/187,477 filed Aug. 7, 2008.

This application is related to co-pending U.S. patent application Ser. No. 12/218,558 and U.S. patent application Ser. No. 12/218,582 filed Jul. 16, 2008.

This application is related to co-pending U.S. patent application Ser. No. 12/123,864 filed May 20, 2008.

This application is related to co-pending U.S. patent application Ser. No. 12/102,550 filed Apr. 14, 2008.

This application is related to co-pending U.S. patent application Ser. No. 12/047,842, and U.S. Ser. No. 12/047,944, filed Mar. 13, 2008.

This application is related to co-pending U.S. patent application Ser. No. 12/023,772, filed Jan. 31, 2008.

This application is related to co-pending U.S. patent application Ser. No. 11/956,069, filed Dec. 13, 2007.

This application is also related to co-pending U.S. patent application Ser. Nos. 11/860,142 and 11/860,183 filed Sep. 24, 2007.

This application is also related to co-pending U.S. patent application Ser. No. 11/836,402 filed Aug. 8, 2007.

This application is also related to co-pending U.S. patent application Ser. No. 11/616,596 filed Dec. 27, 2006.

This application is also related to co-pending U.S. patent application Ser. No. 11/614,332 filed Dec. 21, 2006.

This application is also related to co-pending U.S. patent application Ser. No. 11/445,793 filed Jun. 2, 2006.

This application is also related to co-pending U.S. patent application Ser. No. 11/500,053 filed Aug. 7, 2006.

BACKGROUND OF THE INVENTION

1. Field of the Invention

The present invention relates to the field of semiconductor devices, and to fabrication processes and devices such as multijunction solar cells based on III-V semiconductor compounds including a metamorphic layer. Such devices are also known as inverted metamorphic multijunction solar cells.

2. Description of the Related Art

Solar power from photovoltaic cells, also called solar cells, has been predominantly provided by silicon semiconductor technology. In the past several years, however, high-volume manufacturing of III-V compound semiconductor multijunction solar cells for space applications has accelerated the development of such technology not only for use in space but also for terrestrial solar power applications. Compared to silicon, III-V compound semiconductor multijunction devices have greater energy conversion efficiencies and generally more radiation resistance, although they tend to be more complex to manufacture. Typical commercial III-V compound semiconductor multijunction solar cells have energy efficiencies that exceed 27% under one sun, air mass 0 (AM0), illumination, whereas even the most efficient silicon technologies generally reach only about 18% efficiency under comparable conditions. Under high solar concentration (e.g., 500×), commercially available III-V compound semiconductor multijunction solar cells in terrestrial applications (at AM1.5D) have energy efficiencies that exceed 37%. The higher conversion efficiency of III-V compound semiconductor solar cells compared to silicon solar cells is in part based on the ability to achieve spectral splitting of the incident radiation through the use of a plurality of photovoltaic regions with different band gap energies, and accumulating the current from each of the regions.

Typical III-V compound semiconductor solar cells are fabricated on a semiconductor wafer in vertical, multijunction structures. The individual solar cells or wafers are then disposed in horizontal arrays, with the individual solar cells connected together in an electrical series circuit. The shape and structure of an array, as well as the number of cells it contains, are determined in part by the desired output voltage and current.

In satellite and other space related applications, the size, mass and cost of a satellite power system are dependent on the power and energy conversion efficiency of the solar cells used. Putting it another way, the size of the payload and the availability of on-board services are proportional to the amount of power provided. Thus, as the payloads become more sophisticated and consume more power, the efficiency and mass of the solar cells, which act as the power conversion devices for the on-board power systems, become increasingly more important.

Inverted metamorphic solar cell structures such as described in M. W. Wanlass et al., Lattice Mismatched Approaches for High Performance, III-V Photovoltaic Energy Converters (Conference Proceedings of the 31$^{st}$ IEEE Photovoltaic Specialists Conference, Jan. 3-7, 2005, IEEE Press, 2005) present an important conceptual starting point for the development of future commercial high efficiency solar cells. The structures described in such reference present a number of practical difficulties relating to the appropriate choice of materials and fabrication steps, for a number of different layers of the cell.

Prior to the inventions described in this and the related applications noted above, the materials and fabrication steps disclosed in the prior art have not been adequate to produce a commercially viable and energy efficient inverted metamorphic multijunction solar cell using commercially established fabrication processes.

SUMMARY OF THE INVENTION

Briefly, and in general terms, the present invention provides a method of manufacturing a solar cell, by providing a gallium arsenide carrier with a prepared bonding surface; providing a support substrate; bonding the gallium arsenide carrier and the support substrate to produce a composite structure; detaching the bulk of the gallium arsenide carrier from the composite structure, leaving a gallium arsenide substrate on the support substrate; and depositing a sequence of layers of semiconductor material forming a solar cell on the gallium arsenide substrate.

In another aspect, the present invention provides a method of manufacturing a solar cell, by providing a germanium carrier with a prepared bonding surface; providing a support substrate; bonding the germanium carrier and the support substrate to produce a composite structure; detaching the bulk of the germanium carrier from the composite structure, leaving a germanium substrate on the sapphire substrate; and depositing a sequence of layers of semiconductor material forming a solar cell on the germanium substrate.

In another aspect, the present invention further provides subsequently preparing a new bonding surface on the detached bulk portion of the gallium arsenide or germanium carrier to form a new carrier; providing a new support substrate; bonding the new gallium arsenide or germanium carrier and the new support substrate to produce a new composite structure; detaching the bulk of the new gallium arsenide or germanium carrier from the new composite structure, leaving a new gallium arsenide or germanium growth substrate on the new support substrate; and depositing a sequence of layers of semiconductor material forming a solar cell on the new gallium arsenide or germanium growth substrate.

In another aspect, the present invention further provides subsequently mounting a surrogate second substrate on top of the sequence of layers of semiconductor material forming a solar cell; and removing the gallium arsenide or germanium growth substrate.

In another aspect, the present invention provides that depositing the sequence of layers of semiconductor material forming a solar cell includes forming a first subcell on the growth substrate comprising a first semiconductor material with a first band gap and a first lattice constant; forming a second subcell comprising a second semiconductor material with a second band gap and a second lattice constant, wherein the second band gap is less than the first band gap and the second lattice constant is greater than the first lattice constant; forming a lattice constant transition material positioned between the first subcell and the second subcell, said lattice constant transition material having a lattice constant that changes gradually from the first lattice constant to the second lattice constant.

In still another aspect, the present invention provides a method of manufacturing a solar cell by providing a gallium arsenide carrier with a prepared bonding surface; providing a support substrate; bonding the gallium arsenide carrier and the support substrate to produce a composite structure; detaching the bulk of the gallium arsenide carrier from the composite structure, leaving a gallium arsenide substrate on the support substrate; forming a first solar subcell having a first band gap on the gallium arsenide substrate; forming a second solar subcell disposed over the first solar subcell having a second band gap smaller than the first band gap; forming a graded interlayer disposed over the second subcell having a third band gap greater than the second band gap; forming a third solar subcell disposed over the graded interlayer having a fourth band gap smaller than the second band gap and lattice mismatched with respect to the second subcell; and forming a fourth solar subcell disposed over said third subcell having a fifth band gap smaller than said fourth band gap and lattice matched with respect to said third subcell.

Not all of these aspects or features of the present invention need actually be implemented in any one embodiment.

BRIEF DESCRIPTION OF THE DRAWINGS

The invention will be better and more fully appreciated by reference to the following detailed description when considered in conjunction with the accompanying drawings, wherein.

DESCRIPTION OF THE PREFERRED EMBODIMENT

Figure 1A:
FIG. 1A is a cross-sectional view of the support substrate of the present invention.

Details of the present invention will now be described including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

The basic concept of fabricating an inverted metamorphic multijunction (IMM) solar cell is to grow the subcells of the solar cell on a substrate in a "reverse" sequence. That is, the high band gap subcells (i.e. subcells with band gaps in the range of 1.8 to 2.1 eV), which would normally be the "top" subcells facing the solar radiation, are grown epitaxially on a semiconductor growth substrate, such as for example GaAs or Ge, and such subcells are therefore lattice matched to such substrate. One or more lower band gap middle subcells (i.e. with band gaps in the range of 1.2 to 1.8 eV) can then be grown on the high band gap subcells.

At least one lower subcell is formed over the middle subcell such that the at least one lower subcell is substantially lattice mismatched with respect to the growth substrate and such that the at least one lower subcell has a third lower band gap (i.e. a band gap in the range of 0.7 to 1.2 eV). A surrogate substrate or support structure is provided over the "bottom" or substantially lattice mismatched lower subcell, and the growth semiconductor substrate is subsequently removed. (The growth substrate may then subsequently be re-used for the growth of a second and subsequent solar cells).

The lattice constants and electrical properties of the layers in the semiconductor structure are preferably controlled by specification of appropriate reactor growth temperatures and times, and by use of appropriate chemical composition and dopants. The use of a vapor deposition method, such as Organo Metallic Vapor Phase Epitaxy (OMVPE), Metal Organic Chemical Vapor Deposition (MOCVD), Molecular Beam Epitaxy (MBE), or other vapor deposition methods for the reverse growth may enable the layers in the monolithic semiconductor structure forming the cell to be grown with the required thickness, elemental composition, dopant concentration and grading and conductivity type.

A variety of different features of inverted metamorphic multijunction solar cells are disclosed in the related applications noted above. The present invention is directed to an alternative growth and process technology for the epitaxial fabrication of the semiconductor solar cell layers in a multijunction solar cell, and in particular in an inverted metamorphic multijunction solar cell. In the preferred embodiment to be described, the epitaxial layers of the IMM solar cell are grown on a relative thin semiconductor structure which consists of a GaAs or Ge growth template (or other suitable material) attached to a sapphire or sapphire/spinal substrate or support. The sapphire/spinal substrate can be designed or specified and selected to have a coefficient of thermal expansion (CTE) that matches that of relevant III/V compounds such as GaAs, GaInPa, etc. used in the solar cell fabrication.

According to the embodiments described herein, the thin gallium arsenide growth template is formed by bonding a gallium arsenide wafer to a sapphire substrate and detaching the bulk of the gallium arsenide wafer, leaving a thin layer of gallium arsenide on the sapphire substrate. The bulk of the gallium arsenide carrier is detached in such a way that it is not destroyed and can be reused to form additional solar cells on other sapphire substrates. Reusing gallium arsenide carriers in this way to form additional solar cells significantly reduces the per-unit cost of gallium arsenide-based solar cells.

The IMM cell structure is grown on the growth template mentioned above by MOCVD or equivalent growth technology. After growth, the structure is processed. During processing, a release technology is used to remove the sapphire or sapphire/spinal substrate. The sapphire or sapphire/spinal substrate can be reused by attaching another GaAs, Ge (or other) substrate for forming additional solar cells.

The release of the sapphire (or sapphire/spiral) substrate can be done through wet etching or through a layer release process. The wet etching would laterally etch a layer, relaxing the growth substrate and the laser retrace process would melt a layer and accomplish the same kind of release of the growth substrate.

The value of the proposed process is that the grinding and etching of the growth template no longer needs to be done. The main part of the growth template i.e., the sapphire/spinal substrate or support, is also now reusable. Much less GaAs or Ge material is also necessary, just enough of a layer to provide a growth template.

A second advantage of this approach is that different lattice constants can now be used instead of only GaAs or Ge. If a smaller lattice constant than GaAs (or Ge) can be used, then a higher band gap top subcell can now be incorporated into the solar cell versus the use of a GaInP$_2$ subcell (with band gap around 1.90 eV) that is now being used in currently available IMM solar cell structures.

Figure 1B:
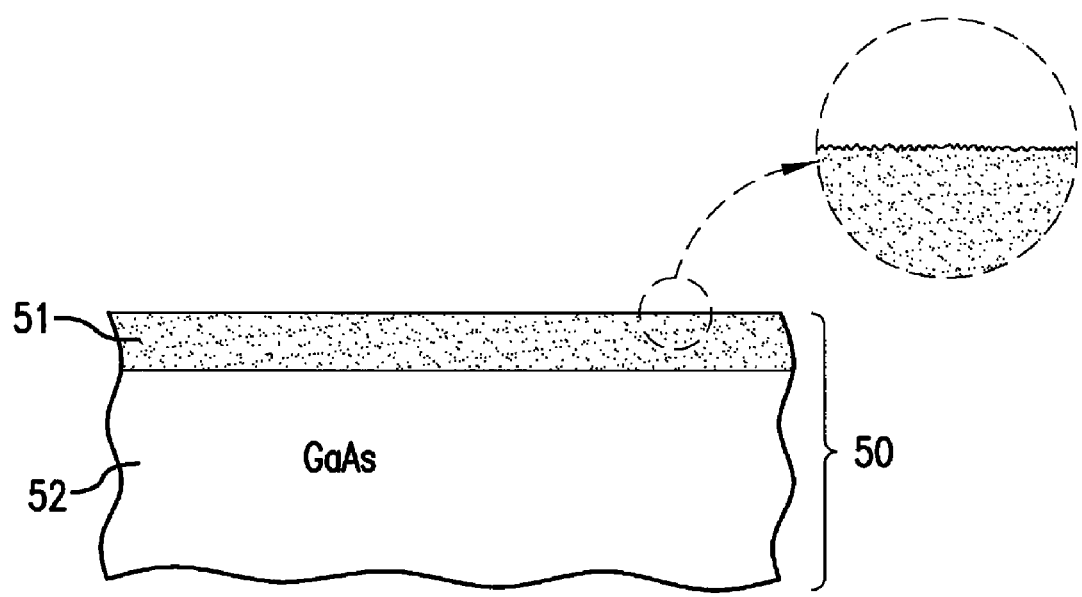
FIG. 1B is a cross-sectional view of the carrier substrate of the present invention after surface preparation.

FIGS. 1A-1D are cross-sectional views of a sapphire substrate 40 and a gallium arsenide carrier 50 during different steps of bonding the carrier 50 to the substrate 40, removing a bulk of the carrier 50 after bonding and forming a solar cell on the remaining gallium arsenide layer 51 bonded to the sapphire substrate 40. FIG. 1A shows the sapphire substrate 40. FIG. 1B shows the gallium arsenide carrier 50. The carrier 50 includes the thin gallium arsenide layer 51 adjacent a bulk region 52 of gallium arsenide.

According to one embodiment, the gallium arsenide layer 51 is formed by implanting a species such as hydrogen ions and/or rare gases into the gallium arsenide carrier 50 to form a defect layer in the gallium arsenide carrier. Any known process for implanting species such as hydrogen ions and/or rare gases into a semiconductor wafer can be used. For example, the gallium arsenide layer 51 can be formed in the carrier 50 in accordance with any of the species implantation techniques disclosed in U.S. Pat. Nos. 7,288,430, 7,235,462, 6,946,317 and 6,794,276, each assigned to S.O.I. Tec Silicon on Insulator Technologies and the contents of which are herein incorporated by reference in their entirety, respectively. The dose and/or energy of the implanted species can be adjusted so that a peak concentration of the implanted species is formed at a certain depth in the carrier 50, thereby weakening the gallium arsenide layer 51 due to the ion implantation at or near this depth. The bulk region 52 of the gallium arsenide carrier 50 is not weakened during the implantation process.

In one embodiment, the gallium arsenide carrier 50 has a prepared bonding surface which can be roughened prior to bonding to the sapphire substrate 40 as illustrated by the exploded view shown in FIG. 1B. The prepared bonding surface of the carrier 50 can be roughened using any suitable chemical or mechanical roughening process. Roughening the surface of the carrier 50 improves the bonding characteristics of the carrier 50.

Figure 1C:
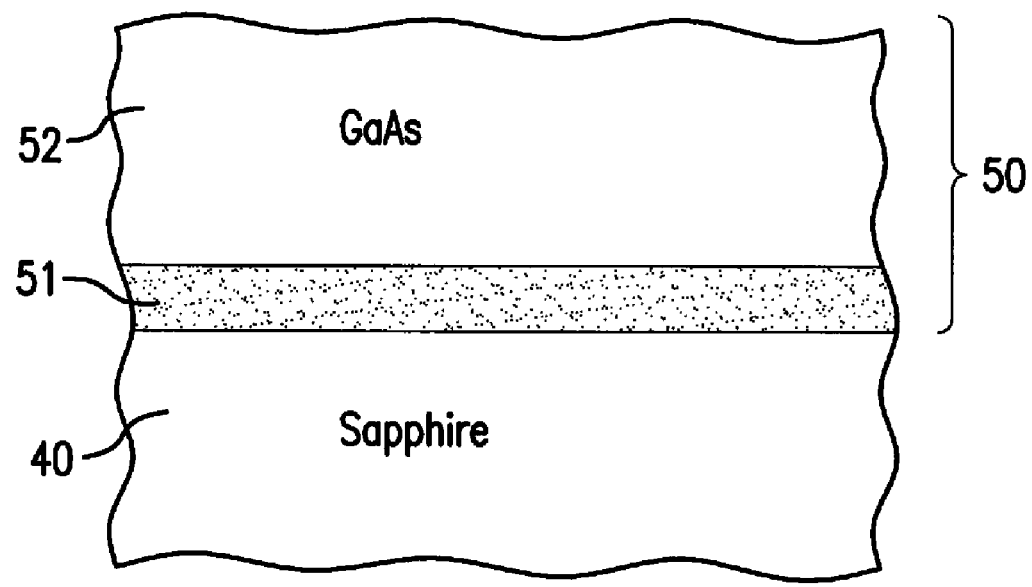
FIG. 1C is a cross-sectional view of the composite structure resulting from the bonding of the support and carrier substrates.

FIG. 1C shows the gallium arsenide carrier 50 and the sapphire substrate 40 after they are bonded together. According to an embodiment, the prepared bonding surface of the gallium arsenide carrier 50 is directly molecularly bonded to a surface of the sapphire substrate 40, e.g., under elevated temperature and pressure. A thin bonding layer between the layer 51 and the sapphire substrate 40 is not shown in the Figures in order to simplify the drawings. According to one embodiment, the weakened layer 51 of gallium arsenide formed by the implantation of species such as hydrogen ions and/or rare gases into the carrier 50 is bonded to the sapphire substrate 40. The bulk 52 of the gallium arsenide carrier 50 is then detached from the composite structure, leaving the thin layer 51 of gallium arsenide on the sapphire substrate 40.

Figure 1D:
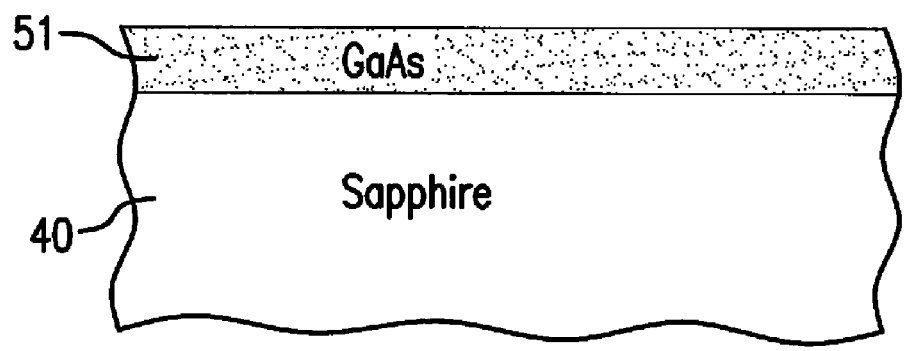
FIG. 1D is a cross-sectional view of the composite structure of FIG. 1C after removal of the bulk of the carrier substrate.

In one embodiment, the bulk 52 of the gallium arsenide carrier 50 is detached from the sapphire substrate 40 by annealing the carrier 50 in a hot environment such as a furnace or any equipment for rapid thermal annealing. The effect of annealing temperature and time further weakens the carrier 50 at the thin gallium arsenide layer 51 introduced by atomic implantation which leads to detaching. By detaching along this region during or after annealing, the thin layer 51 of gallium arsenide remains bonded to the sapphire substrate 40 as shown in FIG. 1D. The detached bulk portion 52 of the carrier 50 is not destroyed, and thus can be reused.

According to one embodiment, the thin gallium arsenide layer 51 bonded to the sapphire substrate 40 has a thickness of about 5 μm and the bulk 52 of the carrier 50 detached from the composite structure has a thickness of about 395 μm. The thin layer 51 of gallium arsenide bonded to the sapphire substrate 40 acts as a substrate on which a solar cell can be formed. In one embodiment, the gallium arsenide layer 51 is prepared or smoothed before a solar cell is formed on the layer 51. Smoothing or surface preparation can be performed using any suitable technique such as chemical-mechanical polishing, etching by gas cluster, ion beam or reactive ion etching, HCL-smoothing, etc. Hereinafter in this application, the thin GaAs layer 51 on the sapphire support 40 will simply be referred to as the "substrate."

As mentioned above, the bulk 52 of the gallium arsenide carrier 50 detached from the sapphire substrate 40 can be reused. In one embodiment, the bulk 52 of the gallium arsenide carrier 50 is reused to form a new solar cell on a new sapphire substrate (not shown) as described above. That is, a new bonding surface is prepared on the detached bulk portion 52 of the gallium arsenide carrier 50 to form a new gallium arsenide carrier. The new gallium arsenide carrier is bonded to a new sapphire substrate to produce a new composite structure. The bulk of the new gallium arsenide carrier is detached from the new composite structure as described above, leaving a new gallium arsenide substrate on the new sapphire substrate. A new sequence of layers of semiconductor material can then be deposited on the new gallium arsenide substrate to form a new solar cell.

Figure 2A:
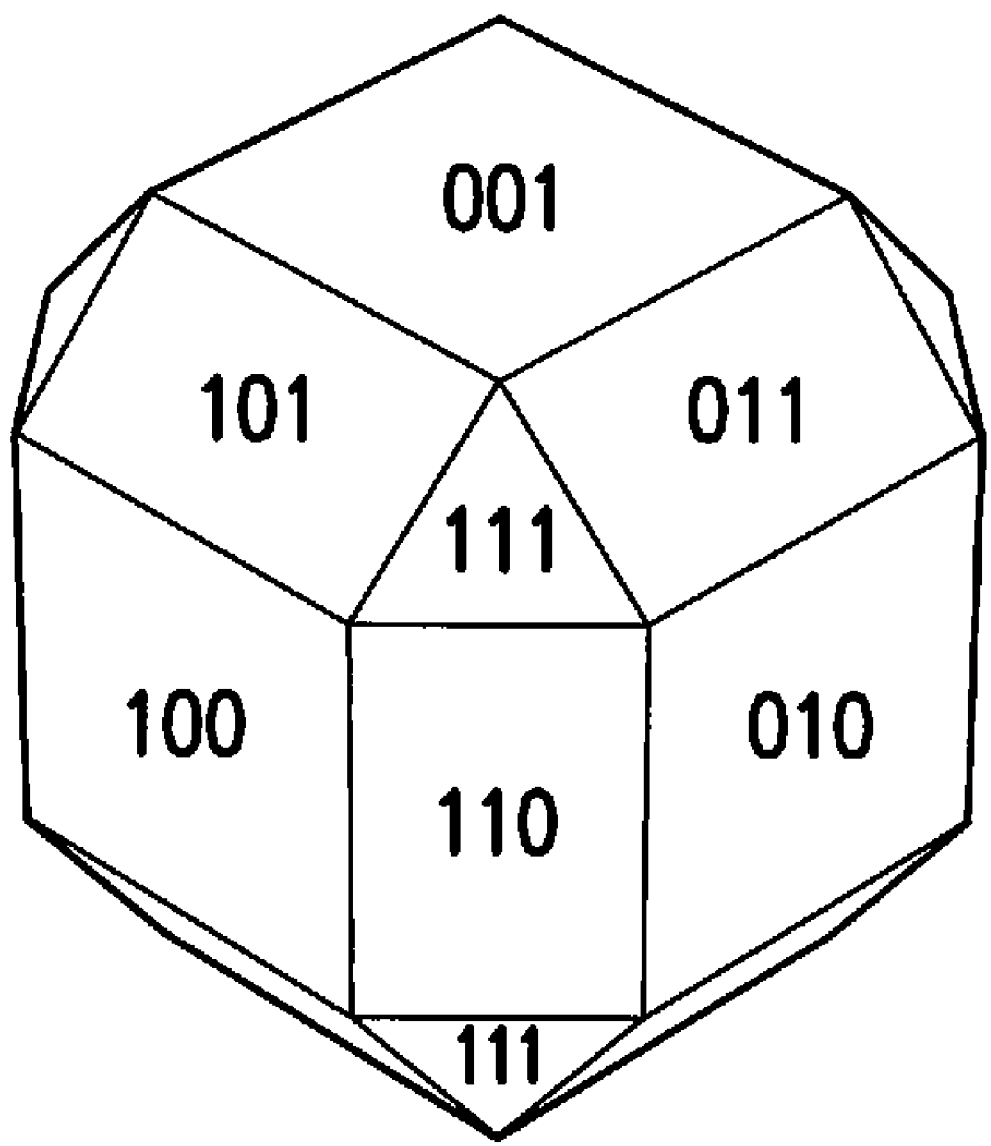
FIG. 2A is a perspective view of a polyhedral representation of a semiconductor lattice structure showing the crystal planes.
Figure 2B:
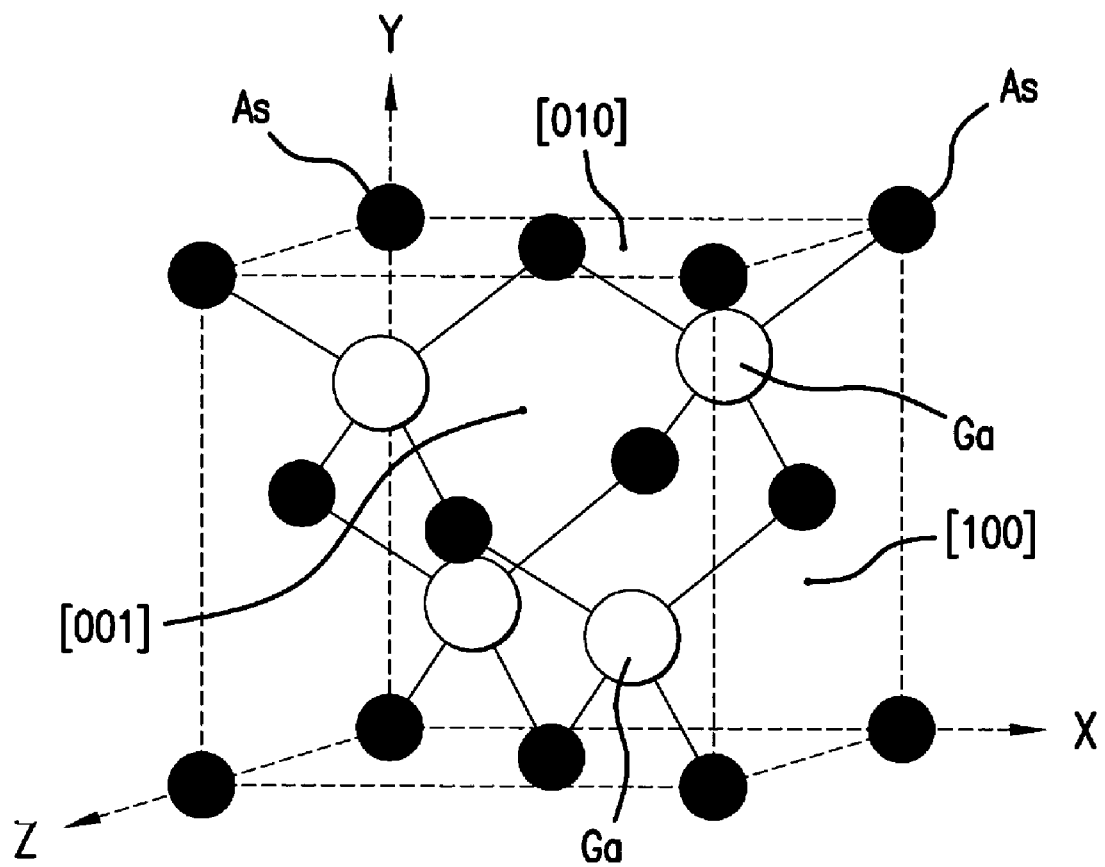
FIG. 2B is a perspective view of the GaAs crystal lattice showing the position of the gallium and arsenic atoms.

The gallium arsenide carrier 50 (as well as the gallium arsenide growth layer or template 51) is preferably an off-cut substrate, as will be more particularly explained with reference to FIGS. 2A through FIG. 3B that follow. FIG. 2A is a perspective view of a polyhedral representation of a semiconductor lattice structure showing the crystal planes. The Miller indices are used to identify the planes, and the crystal structure is represented in the Figure by a truncated cube with the (001) plane at the top. In the case of a GaAs compound semiconductor, which is the material of interest in the present invention, the crystal structure is known as the zinc blended structure, and is shown in FIG. 2B, which represents a combination of two interpenetrating face centered cubic sublattices. The lattice constant (i.e., the distance between the arsenic atoms in the crystal) is 0.565 nm.

FIG. 2B is a perspective view of the GaAs crystal lattice showing the position of the gallium and arsenic atoms, with the corresponding Miller indices identifying the lattice planes.

Figure 3A:
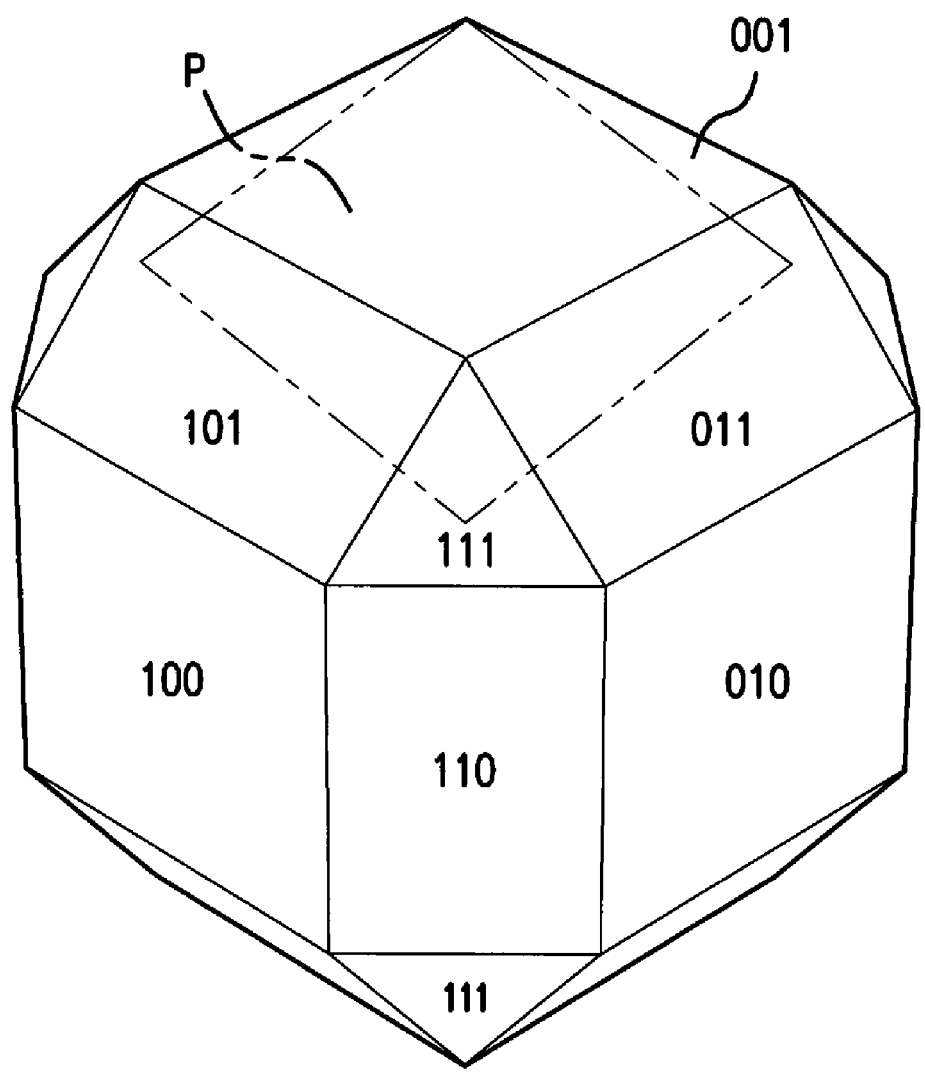
FIG. 3A is a perspective view of the plane P of the substrate employed in the present invention superimposed over the crystal diagram of FIG. 2A.

FIG. 3A is a perspective view of the plane P of the substrate surface employed in the present invention superimposed over the crystal diagram of FIG. 2A. The plane P is seen to pivot from a point on the (001) plane (in this representation, the rear corner of the top surface of the polyhedron) in the direction of the (111) plane, or more accurately the (111)A plane, where the letter "A" refers to the plane formed by the sublattice of arsenic atoms. The angle of pivot according to the present invention defines the angle of off-cut of the substrate defined from the (001) plane by the plane P, which is at least 6° and preferably approximately 15°.

Although the present invention ideally provides for an offcut in the (111)A direction, it may be that during production and fabrication of various wafer lots, the alignment or cutting process is not as precise or exacting as may be specified by the present invention, and the resulting plane P may pivot slightly in the direction of the adjacent (011) or (101) planes, as well as in the direction of the (111)A plane. Such deviations, whether inadvertent or for some other mechanical or structural reason, are contemplated to be within the scope of the present invention as well.

Thus, in the most general form, as used in the present disclosure the recitation "off-cut from the (001) crystal plane by at least 6° towards the (111)A plane" contemplates and includes the off-cut plane P pivoting towards any of the following planes:

(i) an adjacent (111)A plane by at least 6 degrees and at most 20 degrees;

(ii) an adjacent (011) plane by at most approximately one degree;

(iii) an adjacent (101) plane by at most approximately one degree; and (iv) any plane lying in the continuum of planes between (i) and (ii), (i) and (iii), or (ii) and (iii) above.

Figure 3B:
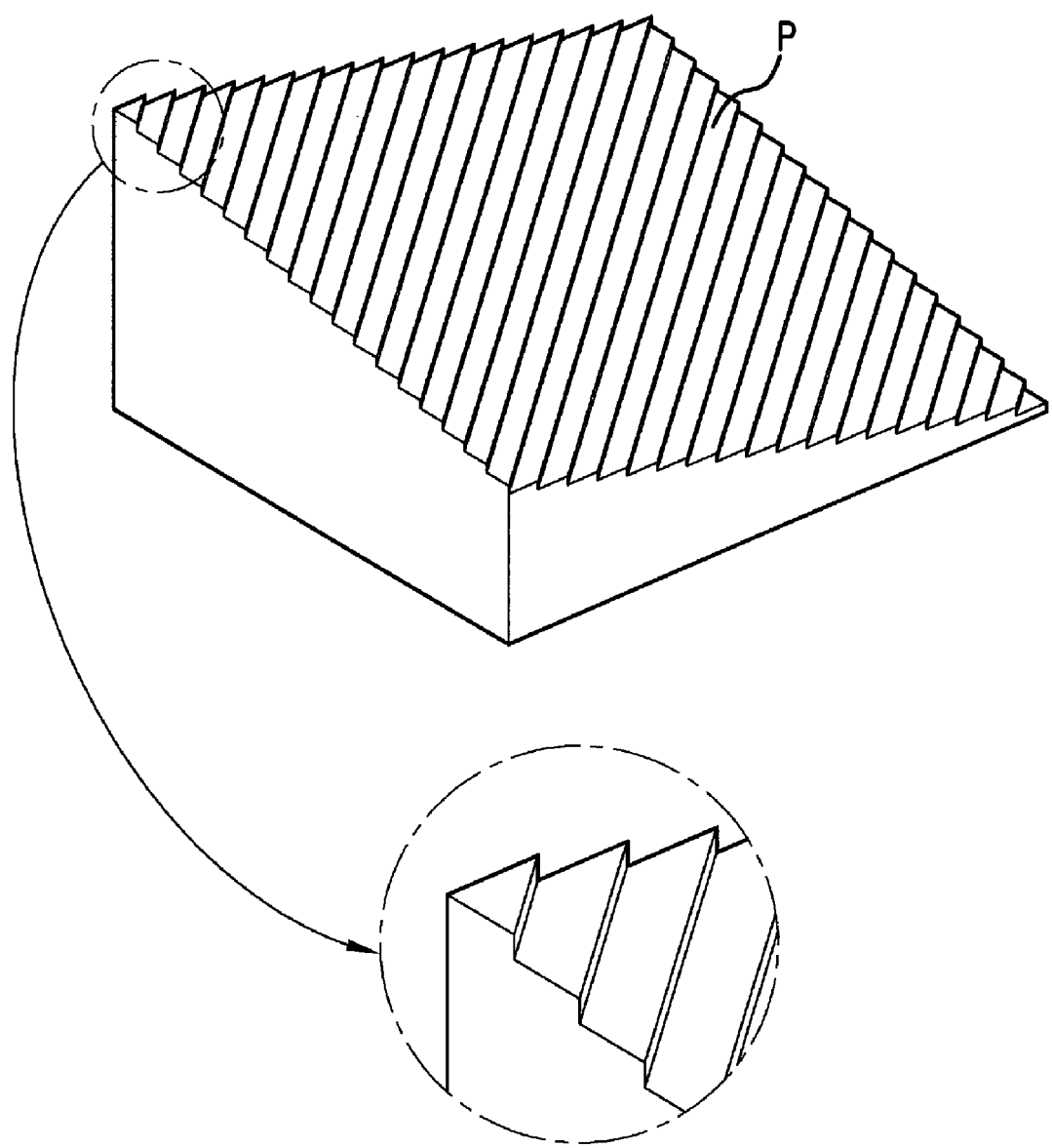
FIG. 3B is a graphical depiction of the surface of the plane of the substrate employed in the present invention.

FIG. 3B is an enlarged perspective view of an off-cut GaAs substrate showing how the off-cut results in a staircase of planar steps extending over the surface of the substrate.

Figure 4A:
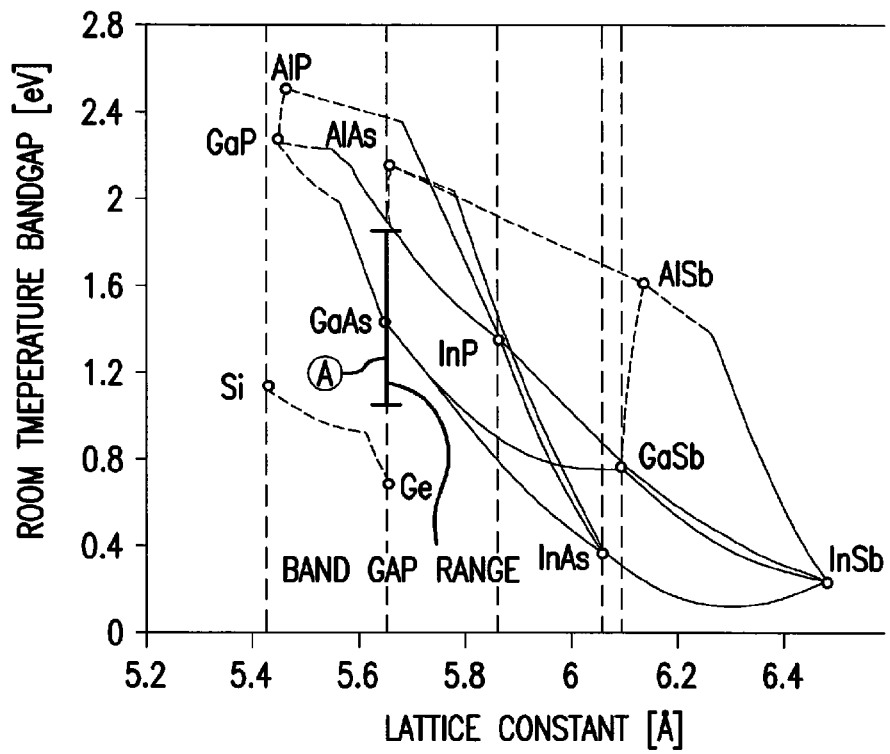
FIG. 4A is a graph representing the band gap of certain binary materials and their lattice constants and a range of materials utilized in an inverted metamorphic multijunction (IMM) solar cell in the prior art.

FIG. 4A is a graph representing the band gap of certain binary materials and their lattice constants. The band gap and lattice constants of ternary materials are located on the lines drawn between typical associated binary materials (such as the ternary material GaAlAs being located between the GaAs and AlAs points on the graph, with the band gap of the ternary material lying between 1.42 eV for GaAs and 2.16 eV for AlAs depending upon the relative amount of the individual constituents). Thus, depending upon the desired band gap, the material constituents of ternary materials can be appropriately selected for growth. The line A drawn on the graph represents one of the material combinations of band gaps and lattice constants of ternary materials that can be grown on a gallium arsenide substrate as is known in the prior art.

Figure 4B:
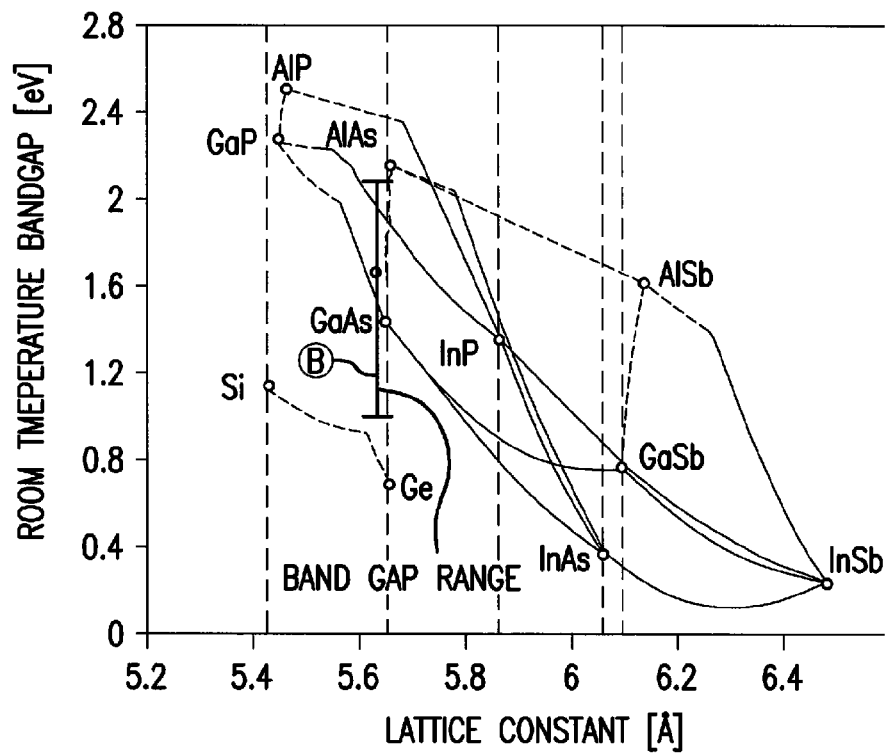
FIG. 4B is a graph representing the band gap of certain binary materials and their lattice constants and a range of materials utilized in an inverted metamorphic multijunction (IMM) solar cell according to the present invention.

FIG. 4B is a graph representing the band gap of certain binary materials and their lattice constants as shown in FIG. 4A, with the line B representing one of the material combinations of band gaps and lattice constants of ternary materials that can be grown on an alternate substrate according to the present invention. Thus, depending upon the desired band gap, the material constituents of the growth template and the ternary materials that can be lattice matched to it can be appropriately selected for design of new solar cell subcell sequences.

Figure 5:
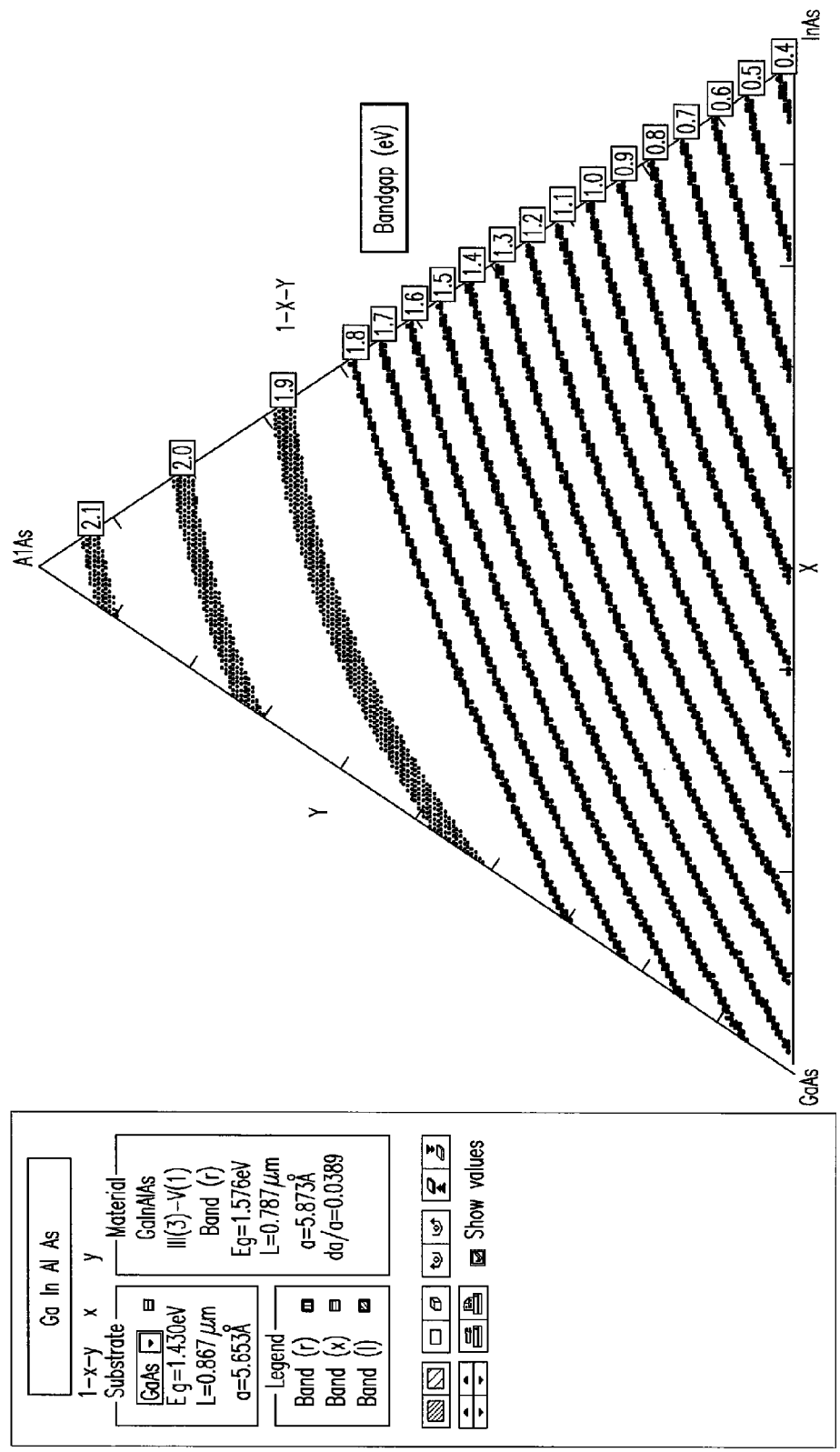
FIG. 5 is a diagram representing the range of band gaps of various GaInAlAs materials as a function of the relative concentration of Al, In, and Ga.

FIG. 5 is a diagram representing the range of band gaps of various GaInAlAs materials as a function of the relative concentration of Al, In, and Ga. This diagram illustrates how the selection of a constant band gap sequence of layers of GaInAlAs used in the metamorphic layer may be designed through the appropriate selection of the relative concentration of Al, In, and Ga to meet the different lattice constant requirements for each successive layer. Thus, whether 1.5 eV or 1.1 eV or other band gap value is the desired constant band gap, the diagram illustrates a continuous curve for each band gap, representing the incremental changes in constituent proportions as the lattice constant changes, in order for the layer to have the required band gap and lattice constant.

Figure 6:
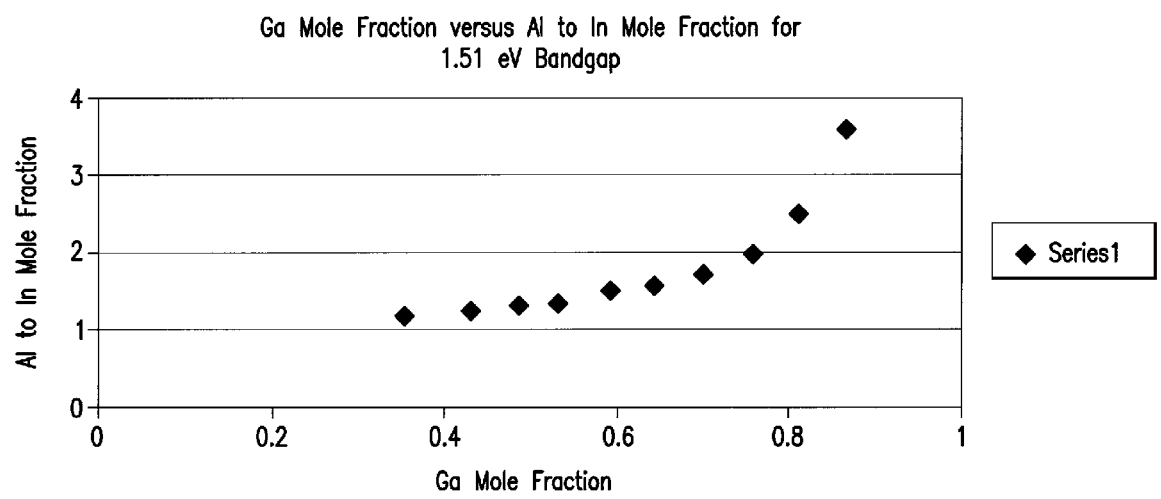
FIG. 6 is a graph representing the Ga mole fraction versus the Al to In mole fraction in GaInAlAs materials that is necessary to achieve a constant 1.5 eV band gap.

FIG. 6 is a graph that further illustrates the selection of a constant band gap sequence of layers of GaInAlAs used in the metamorphic layer by representing the Ga mole fraction versus the Al to In mole fraction in GaInAlAs materials that is necessary to achieve a constant 1.5 eV band gap.

Figure 7:
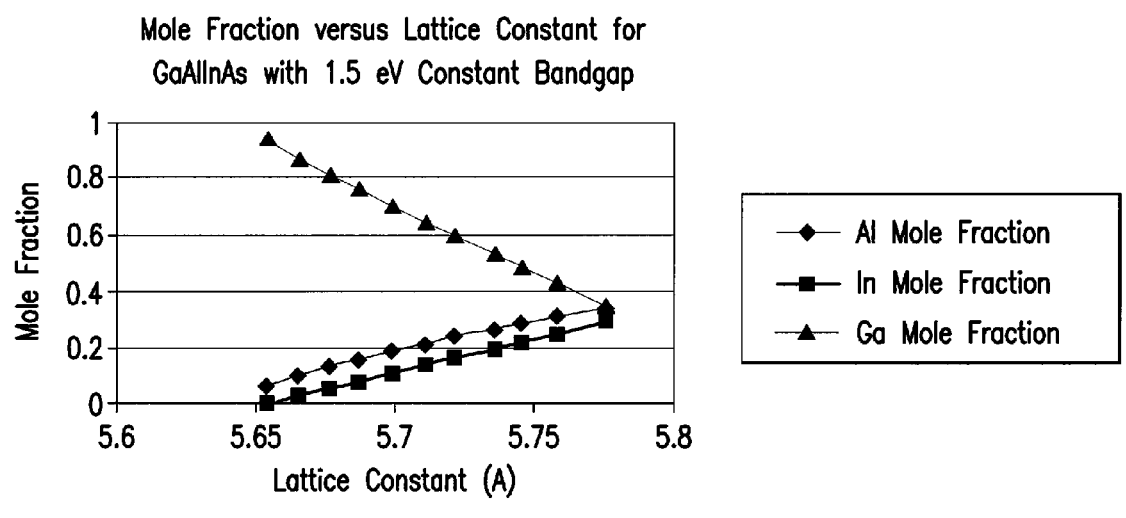
FIG. 7 is a graph representing the mole fraction versus lattice constant in GaInAlAs materials that is necessary to achieve a constant 1.5 eV band gap.

FIG. 7 is a graph that further illustrates the selection of a constant band gap sequence of layers of GaInAlAs used in the metamorphic layer by representing the mole fraction versus lattice constant in GaInAlAs materials that is necessary to achieve a constant 1.5 eV band gap.

Figure 8:
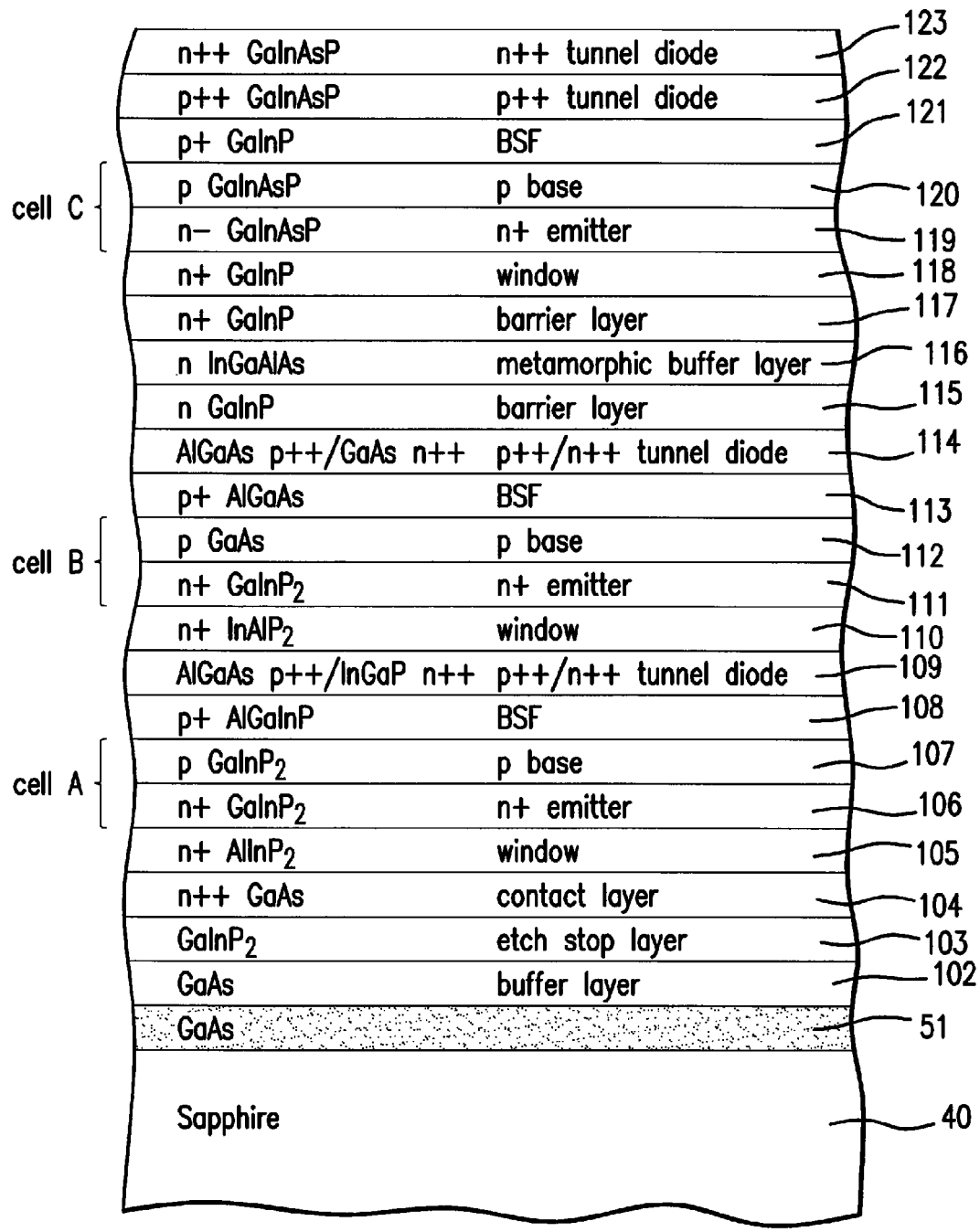
FIG. 8 is a cross-sectional view of the solar cell of the invention after the deposition of semiconductor layers on the growth substrate.

FIG. 8 depicts a portion of the multijunction solar cell to be fabricated according to the present invention after the sequential formation of the three subcells A, B and C on a GaAs growth substrate. More particularly, there is shown a growth substrate 51 mounted over a support 40, as derived from the process shown in FIGS. 1A through 1D. The growth substrate is preferably gallium arsenide (GaAs), but may also be germanium (Ge) or other suitable material. For GaAs, the substrate is preferably a 15° off-cut substrate, that is to say, its surface is orientated 15° off the (100) plane towards the (111)A plane, as more fully described in U.S. patent application Ser. No. 12/047,944, filed Mar. 13, 2008.

In the case of a Ge substrate, a nucleation layer (not shown) is deposited directly on the substrate 51. On the substrate, or over the nucleation layer (in the case of a Ge substrate), a buffer layer 102 and an etch stop layer 103 are further deposited. In the case of GaAs substrate, the buffer layer 102 is preferably GaAs. In the case of Ge substrate, the buffer layer 102 is preferably InGaAs. A contact layer 104 of GaAs is then deposited on layer 103, and a window layer 105 of AlInP is deposited on the contact layer. The subcell A, consisting of an n+ emitter layer 106 and a p-type base layer 107, is then epitaxially deposited on the window layer 105. The subcell A is generally lattice matched to the growth substrate 101.

It should be noted that the multijunction solar cell structure could be formed by any suitable combination of group III to V elements listed in the periodic table subject to lattice constant and band gap requirements, wherein the group III includes boron (B), aluminum (Al), gallium (Ga), indium (In), and thallium (T). The group IV includes carbon (C), silicon (Si), germanium (Ge), and tin (Sn). The group V includes nitrogen (N), phosphorus (P), arsenic (As), antimony (Sb), and bismuth (Bi).

In the preferred embodiment, the emitter layer 106 is composed of InGa(Al)P and the base layer 107 is composed of InGa(Al)P. The aluminum or Al term in parenthesis in the preceding formula means that Al is an optional constituent, and in this instance may be used in an amount ranging from 0% to 30%. The doping profile of the emitter and base layers 106 and 107 according to the present invention will be discussed in conjunction with FIG. 23.

Subcell A will ultimately become the "top" subcell of the inverted metamorphic structure after completion of the process steps according to the present invention to be described hereinafter.

On top of the base layer 107 a back surface field ("BSF") layer 108 is deposited and used to reduce recombination loss, preferably p+ AlGaInP.

The BSF layer 108 drives minority carriers from the region near the base/BSF interface surface to minimize the effect of recombination loss. In other words, the BSF layer 108 reduces recombination loss at the backside of the solar subcell A and thereby reduces the recombination in the base.

On top of the BSF layer 108 is deposited a sequence of heavily doped p-type and n-type layers 109 which forms a tunnel diode which is an ohmic circuit element to connect subcell A to subcell B. These layers are preferably composed of p++ AlGaAs, and n++ InGaP.

On top of the tunnel diode layers 109 a window layer 110 is deposited, preferably n+ InAlP. The window layer 110 used in the subcell B operates to reduce the interface recombination loss. It should be apparent to one skilled in the art, that additional layer(s) may be added or deleted in the cell structure without departing from the scope of the present invention.

On top of the window layer 110 the layers of subcell B are deposited: the n-type emitter layer 111 and the p-type base layer 112. These layers are preferably composed of InGaP and $In_{0.015}GaAs$ respectively (for a Ge substrate or growth template), or InGaP and GaAs respectively (for a GaAs substrate), although any other suitable materials consistent with lattice constant and band gap requirements may be used as well. Thus, subcell B may be composed of a GaAs, GaInP, GaInAs, GaAsSb, or GaInAsN emitter region and a GaAs, GaInAs, GaAsSb, or GaInAsN base region. The doping profile of layers 111 and 112 according to the present invention will be discussed in conjunction with FIG. 23.

In the preferred embodiment of the present invention, the middle subcell emitter has a band gap equal to the top subcell emitter, and the bottom subcell emitter has a band gap greater than the band gap of the base of the middle subcell. Therefore, after fabrication of the solar cell, and implementation and operation, neither the middle subcell B nor the bottom subcell C emitters will be exposed to absorbable radiation. Substantially radiation will be absorbed in the bases of cells B and C, which have narrower band gaps than the emitters. Therefore, the advantages of using heterojunction subcells are: (i) the short wavelength response for both subcells will improve, and (ii) the bulk of the radiation is more effectively absorbed and collected in the narrower band gap base. The effect will be to increase $J_{sc}$.

On top of the cell B is deposited a BSF layer 113 which performs the same function as the BSF layer 109. A p++/n++ tunnel diode 114 is deposited over the BSF layer 113 similar to the layers 109, again forming an ohmic circuit element to connect subcell B to subcell C. These layers 114 are preferably compound of p++ AlGaAs and n++ InGaP.

A barrier layer 115, preferably composed of n-type InGa(Al)P, is deposited over the tunnel diode 114, to a thickness of about 1.0 micron. Such barrier layer is intended to prevent threading dislocations from propagating, either opposite to the direction of growth into the middle and top subcells A and B, or in the direction of growth into the bottom subcell C, and is more particularly described in copending U.S. patent application Ser. No. 11/860,183, filed Sep. 24, 2007.

A metamorphic layer (or graded interlayer) 116 is deposited over the barrier layer 115 using a surfactant, Layer 116 is preferably a compositionally step-graded series of InGaAlAs layers, preferably with monotonically changing lattice constant, so as to achieve a gradual transition in lattice constant in the semiconductor structure from subcell B to subcell C while minimizing threading dislocations from occurring. The band gap of layer 116 is constant throughout its thickness preferably approximately 1.5 eV or otherwise consistent with a value slightly greater than the base band gap of the middle subcell B. The preferred embodiment of the graded interlayer may also be expressed as being composed of $(In_xGa_{1-x})_y Al_{y-1}As$, with x and y selected such that the band gap of the interlayer remains constant at approximately 1.50 eV.

In the surfactant assisted growth of the metamorphic layer 116, a suitable chemical element is introduced into the reactor during the growth of layer 116 to improve the surface characteristics of the layer. In the preferred embodiment, such element may be a dopant or donor atom such as selenium (Se) or tellurium (Te). Small amounts of Se or Te are therefore incorporated in the metamorphic layer 116, and remain in the finished solar cell. Although Se or Te are the preferred n-type dopant atoms, other non-isoelectronic surfactants may be used as well.

Surfactant assisted growth results in a much smoother or planarized surface. Since the surface topography affects the bulk properties of the semiconductor material as it grows and the layer becomes thicker, the use of the surfactants minimizes threading dislocations in the active regions, and therefore improves overall solar cell efficiency.

As an alternative to the use of non-isoelectronic surfactants one may use an isoelectronic surfactant. The term "isoelectronic" refers to surfactants such as antimony (Sb) or bismuth (Bi), since such elements have the same number of valence electrons as the P atom of InGaP, or the As atom in InGaAlAs, in the metamorphic buffer layer. Such Sb or Bi surfactants will not typically be incorporated into the metamorphic layer 116.

In an alternative embodiment where the solar cell has only two subcells, and the "middle" cell B is the uppermost or top subcell in the final solar cell, wherein the "top" subcell A would typically have a band gap of 1.8 to 1.9 eV, then the band gap of the interlayer would remain constant at 1.9 eV.

In the inverted metamorphic structure described in the Wanlass et al. paper cited above, the metamorphic layer consists of nine compositionally graded InGaP steps, with each step layer having a thickness of 0.25 micron. As a result, each layer of Wanlass et al. has a different band gap. In the preferred embodiment of the present invention, the layer 116 is composed of a plurality of layers of InGaAlAs, with monotonically changing lattice constant, each layer having the same band gap, approximately 1.5 eV.

The advantage of utilizing a constant band gap material such as InGaAlAs is that arsenide-based semiconductor material is much easier to process in standard commercial MOCVD reactors, while the small amount of aluminum assures radiation transparency of the metamorphic layers.

Although the preferred embodiment of the present invention utilizes a plurality of layers of InGaAlAs for the metamorphic layer 116 for reasons of manufacturability and radiation transparency, other embodiments of the present invention may utilize different material systems to achieve a change in lattice constant from subcell B to subcell C. Thus, the system of Wanlass using compositionally graded InGaP is a further embodiment of the present invention. Other embodiments of the present invention may utilize continuously graded, as opposed to step graded, materials. More generally, the graded interlayer may be composed of any of the As, P, N, Sb based III-V compound semiconductors subject to the constraints of having the in-plane lattice parameter greater or equal to that of the second solar cell and less than or equal to that of the third solar cell, and having a band gap energy greater than that of the second solar cell.

In another embodiment of the present invention, an optional second barrier layer 117 may be deposited over the InGaAlAs metamorphic layer 116. The second barrier layer 117 will typically have a different composition than that of barrier layer 115, and performs essentially the same function of preventing threading dislocations from propagating. In the preferred embodiment, barrier layer 117 is n+ type GaInP.

A window layer 118 preferably composed of n+ type GaInP is then deposited over the barrier layer 117 (or directly over layer 116, in the absence of a second barrier layer). This window layer operates to reduce the recombination loss in subcell "C". It should be apparent to one skilled in the art that additional layers may be added or deleted in the cell structure without departing from the scope of the present invention.

On top of the window layer 118, the layers of cell C are deposited: the n+ emitter layer 119, and the p-type base layer 120. These layers are preferably composed of n type InGaAs and p type InGaAsP respectively, or n type InGaP and p type InGaAs for a heterojunction subcell, although another suitable materials consistent with lattice constant and band gap requirements may be used as well. The doping profile of layers 119 and 120 will be discussed in connection with FIG. 23.

A BSF layer 121, preferably composed of p+ GaInP, is then deposited on top of the cell C, the BSF layer performing the same function as the BSF layers 108 and 113.

Next, a tunnel diode with layers 122 and 123 is deposited over the BSF layer 121 similar to the layers 114 and 109, again forming an ohmic circuit element to connect subcell C to subcell D. The p++ layer 122 is preferably composed of GaInAsP, and the n++ layer 123 is preferably composed of GaInAsP.

Figure 9:
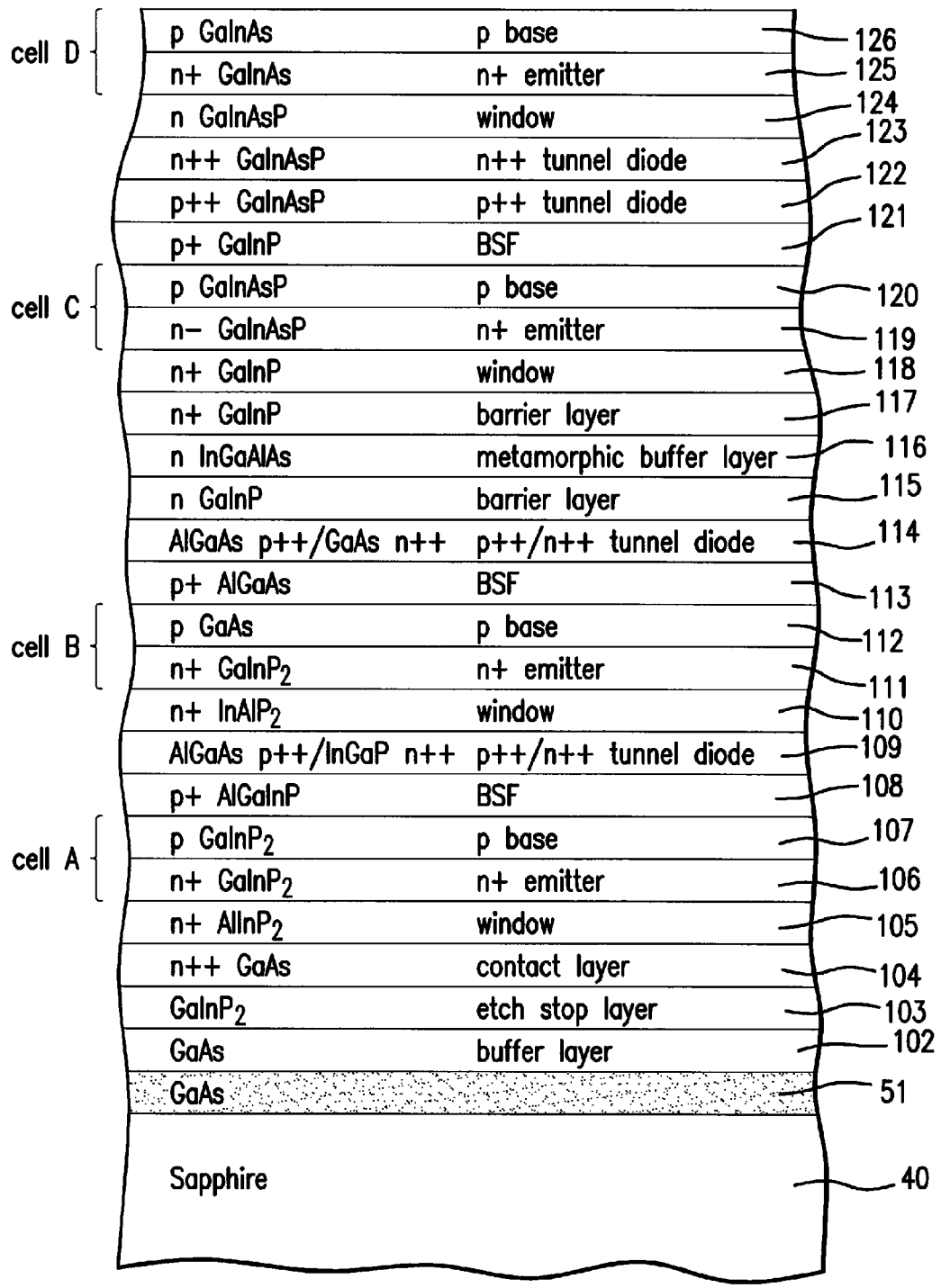
FIG. 9 is a cross-sectional view of the solar cell of FIG. 8 after the next sequence of process steps.

In FIG. 9, a window layer 124 preferably composed of n type GaInAsP is then deposited over the tunnel diode layer 123. This window layer operates to reduce the recombination loss in subcell "D". It should be apparent to one skilled in the art that additional layers may be added or deleted in the cell structure without departing from the scope of the present invention.

On top of the window layer 124, the layers of cell D are deposited: the n+ emitter layer 125, and the p-type base layer 126. These layers are preferably composed of n type GaInAs and p type GaInAs respectively, or n type InGaP and p type InGaAs for a heterojunction subcell, although another suitable materials consistent with lattice constant and band gap requirements may be used as well. The doping profile of layers 125 and 126 will be discussed in connection with FIG. 23.

Figure 10:
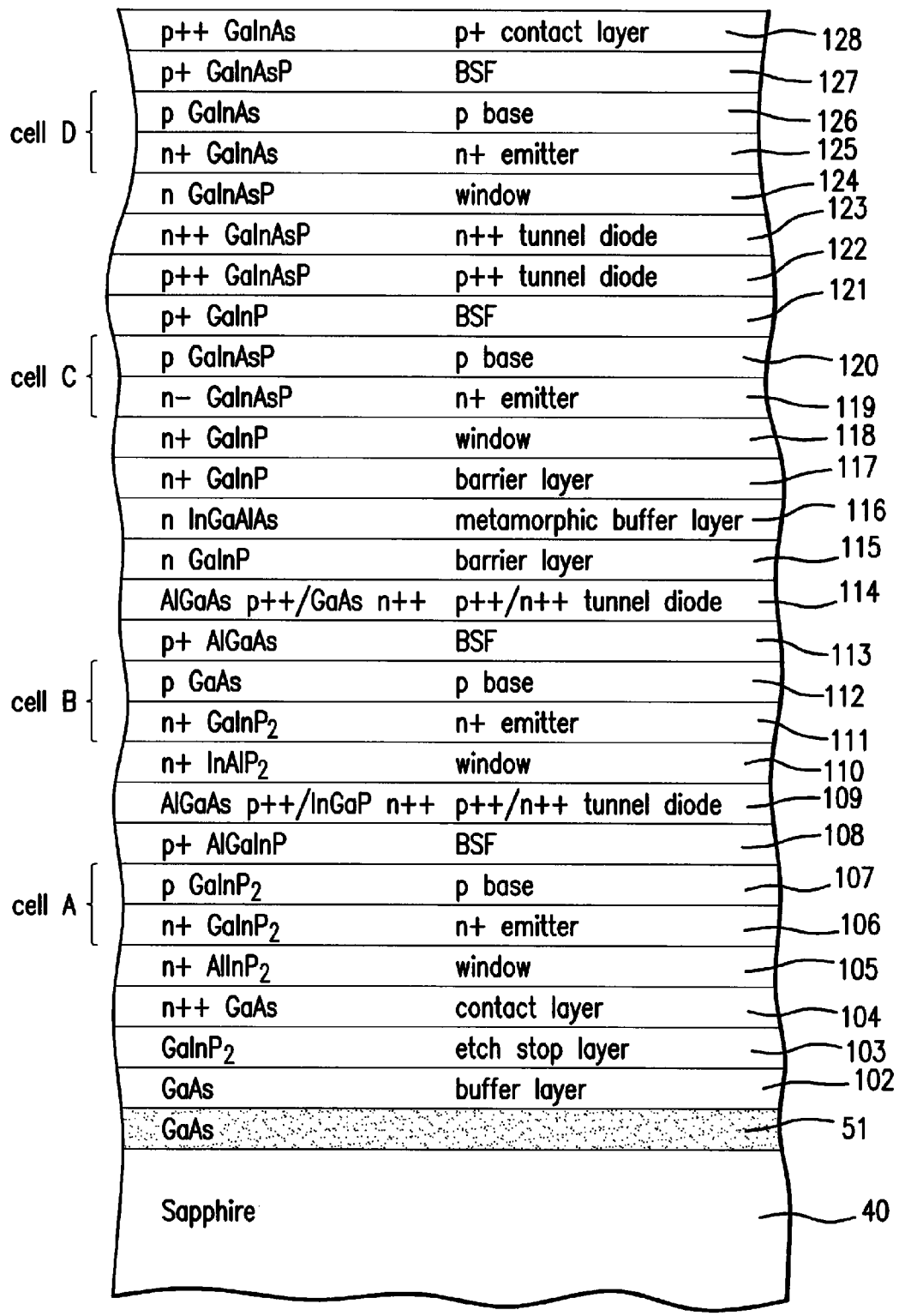
FIG. 10 is a cross-sectional view of the solar cell of FIG. 9 after the next sequence of process steps.

Next, as shown in FIG. 10, a BSF layer 127, preferably composed of p+ GaInAsP, is then deposited on top of the cell D, the BSF layer performing the same function as the BSF layers 108, 113 and 121.

Finally, a p+ contact layer 128, preferably composed of p+ GaInAs is deposited on the BSF layer 127.

In the next process step, a metal contact layer 129 is deposited over the p+ semiconductor contact layer 128. The metal is preferably the sequence of metal layers Ti/Au/Ag/Au, although other suitable materials and sequences can be used as well.

Also, the metal contact materials and layers are chosen so that it has a planar interface with the underlying semiconductor contact layer, after heat treatment to activate the ohmic contact. This is done so that (i) a dielectric layer separating the metal from the semiconductor doesn't have to be deposited and selectively etched in the metal contact areas; and (ii) the contact layer is specularly reflective over the wavelength range of interest.

Figure 11:
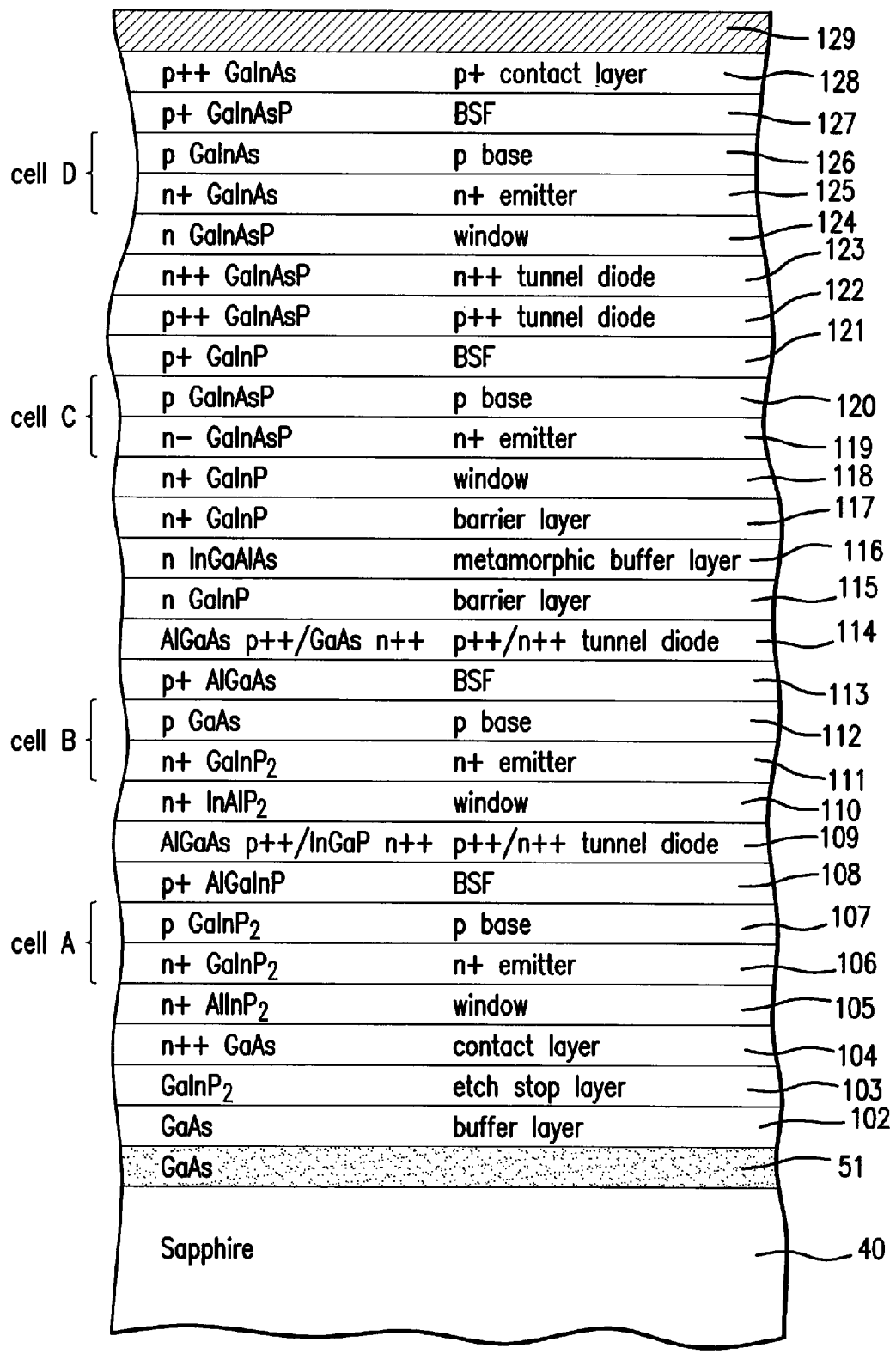
FIG. 11 is a cross-sectional view of the solar cell of FIG. 10 after the next sequence of process steps.
Figure 12:
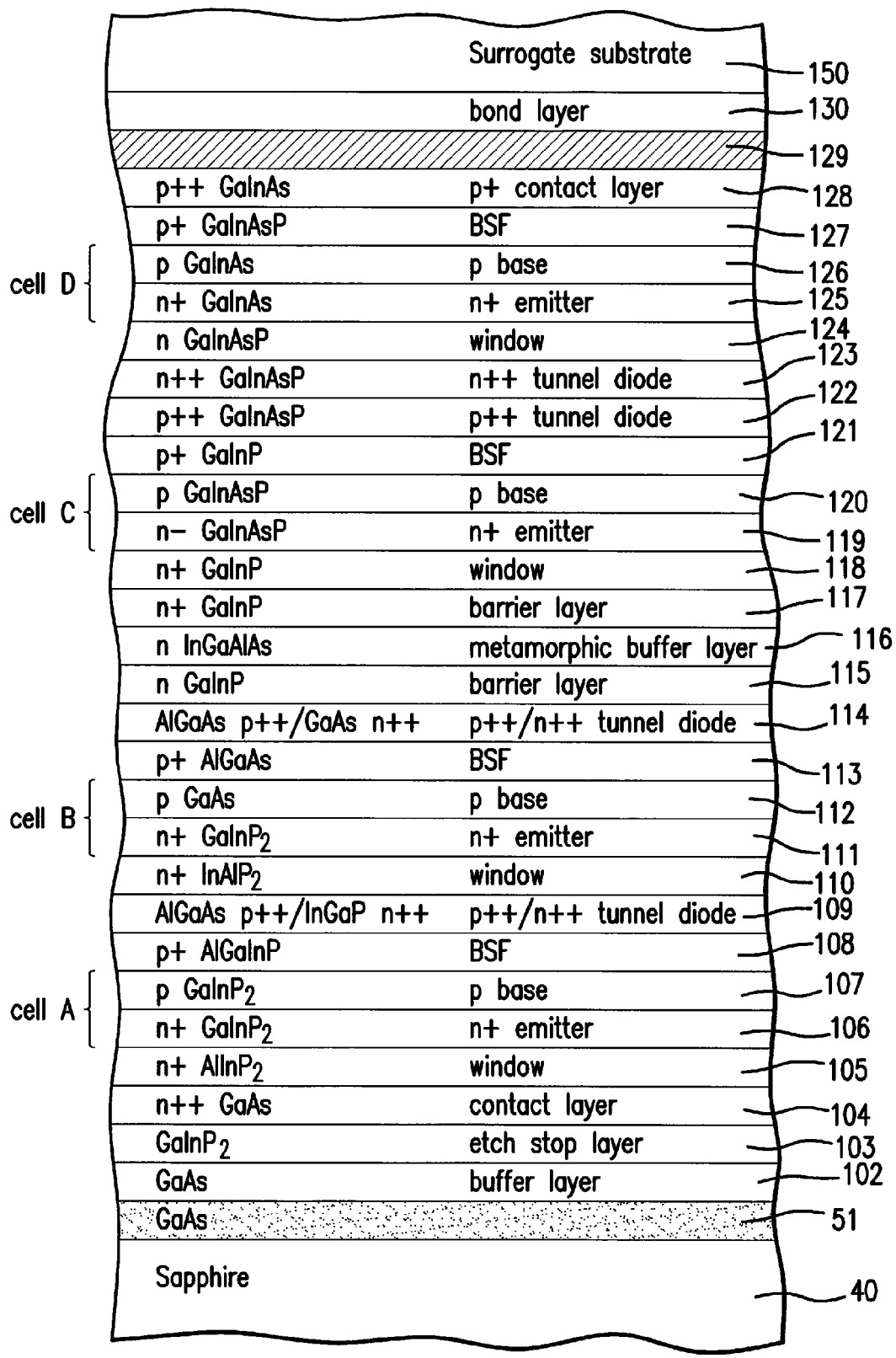
FIG. 12 is a cross-sectional view of the solar cell of FIG. 11 after the next process step in which a surrogate substrate is attached.

FIG. 12 is a cross-sectional view of the solar cell of FIG. 11 after the next process step in which a bonding layer 130 is deposited over the metal layer 129. In one embodiment of the present invention, the bonding layer is an adhesive, preferably Wafer Bond (manufactured by Brewer Science, Inc. of Rolla, Mo.). In other embodiments of the present invention, a solder or eutectic bonding layer 130, such as described in U.S. patent application Ser. No. 12/271,127 filed Nov. 14, 2008, or a bonding layer 130 such as described in U.S. patent application Ser. No. 12/265,113 filed Nov. 5, 2008, may be used, where the surrogate substrate remains a permanent supporting component of the finished solar cell.

Figure 13A:
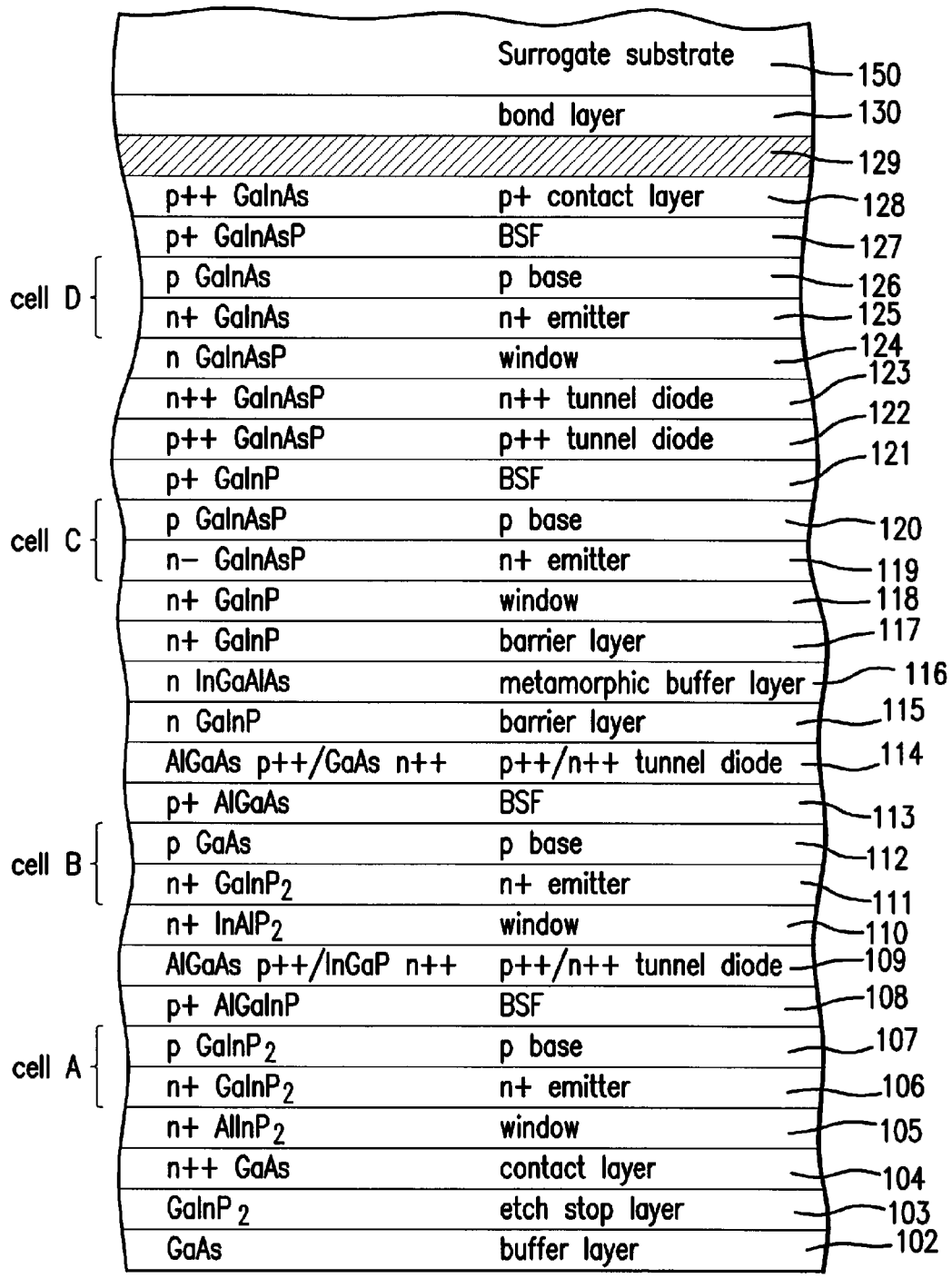
FIG. 13A is a cross-sectional view of the solar cell of FIG. 12 after the next process step in which the original substrate is removed.

FIG. 13A is a cross-sectional view of the solar cell of FIG. 12 after the next process step in which a surrogate substrate 150, preferably sapphire, is attached. Alternatively, the surrogate substrate may be GaAs, Ge or Si, or other suitable material. The surrogate substrate is about 40 mils in thickness, and in the case of embodiments in which the surrogate substrate is to be removed, it is perforated with holes about 1 mm in diameter, spaced 4 mm apart, to aid in subsequent removal of the adhesive and the substrate.

In the next process step, also depicted in FIG. 13A, the original growth substrate 51 and support 40 are removed by localized heating with a laser, and subsequent etching to remove layers 51 and 102.

Figure 13B:
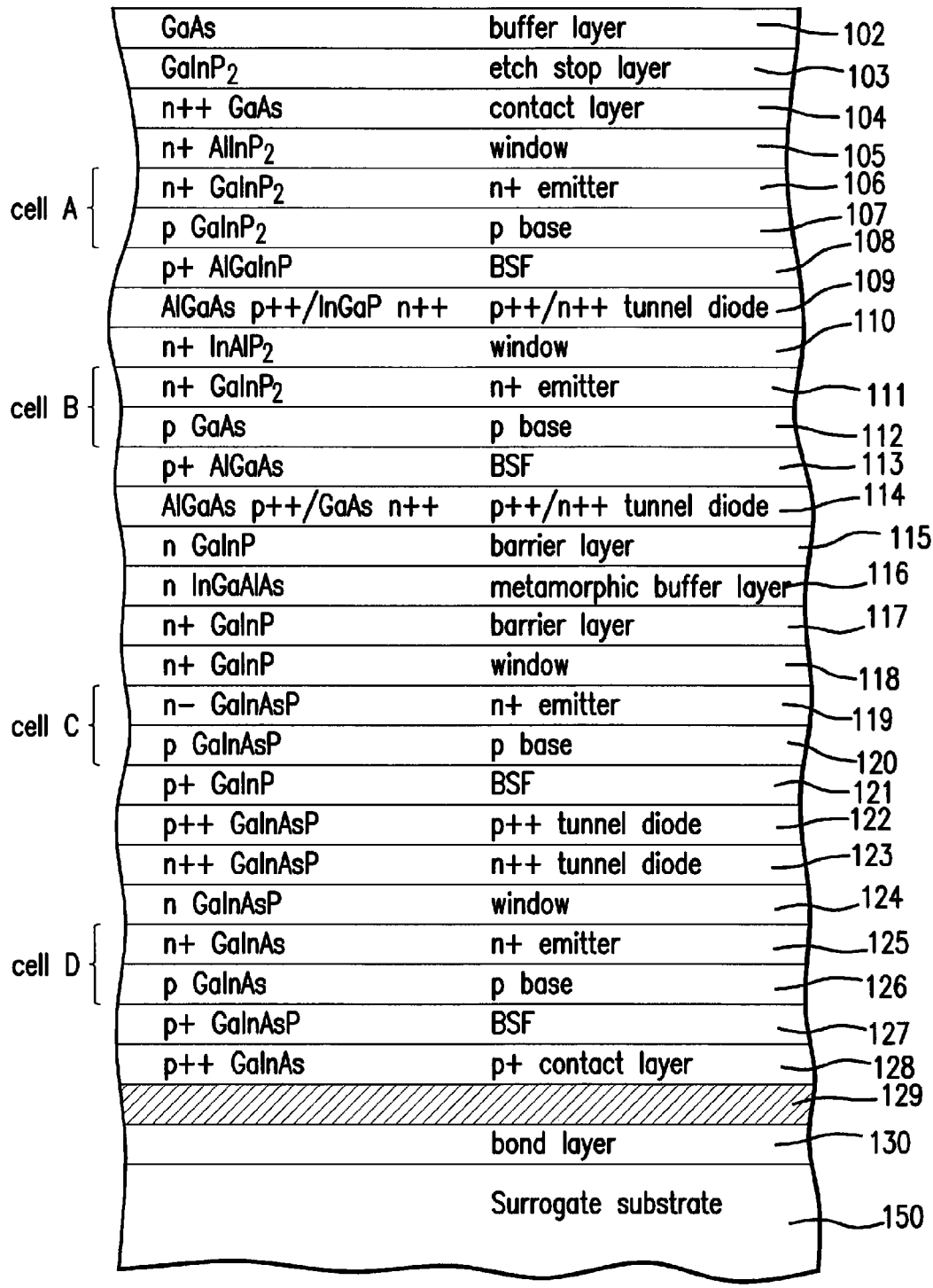
FIG. 13B is another cross-sectional view of the solar cell of FIG. 13A with an orientation depicting the surrogate substrate at the bottom of the Figure.

FIG. 13B is a cross-sectional view of the solar cell of FIG. 13A with the orientation with the surrogate substrate 150 being at the bottom of the Figure. Subsequent Figures in this application will assume such orientation.

Figure 14:
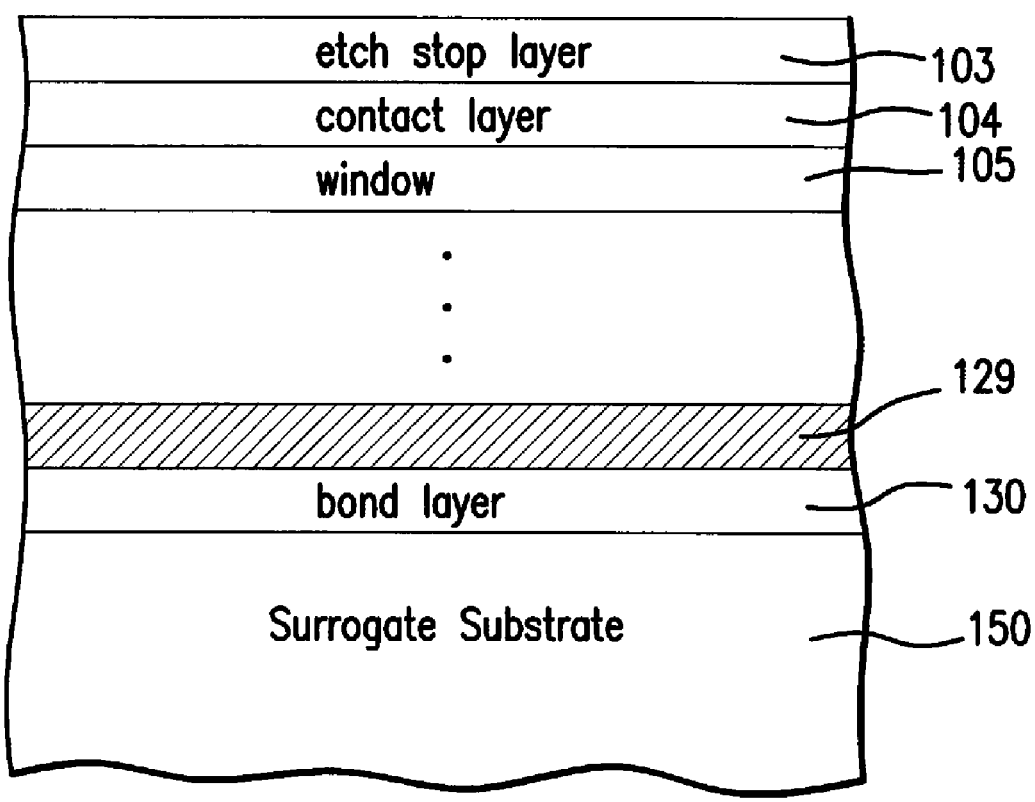
FIG. 14 is a highly simplified cross-sectional view of the solar cell of FIG. 13B.

FIG. 14 is a simplified cross-sectional view of the solar cell of FIG. 13B depicting just a few of the top layers and lower layers over the surrogate substrate 150, after the removal of the buffer layer 102.

Figure 15:
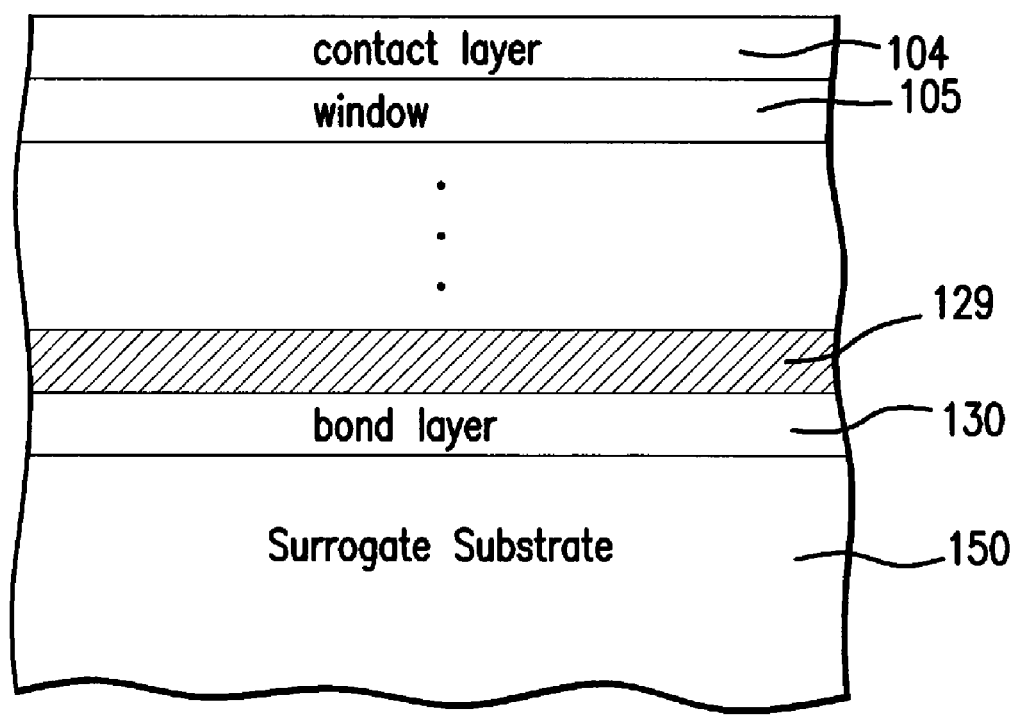
FIG. 15 is a cross-sectional view of the solar cell of FIG. 14 after the next process step.

FIG. 15 is a cross-sectional view of the solar cell of FIG. 14 after the next process step in which the etch stop layer 103 is removed by a HCl/H$_2$O solution.

Figure 16:
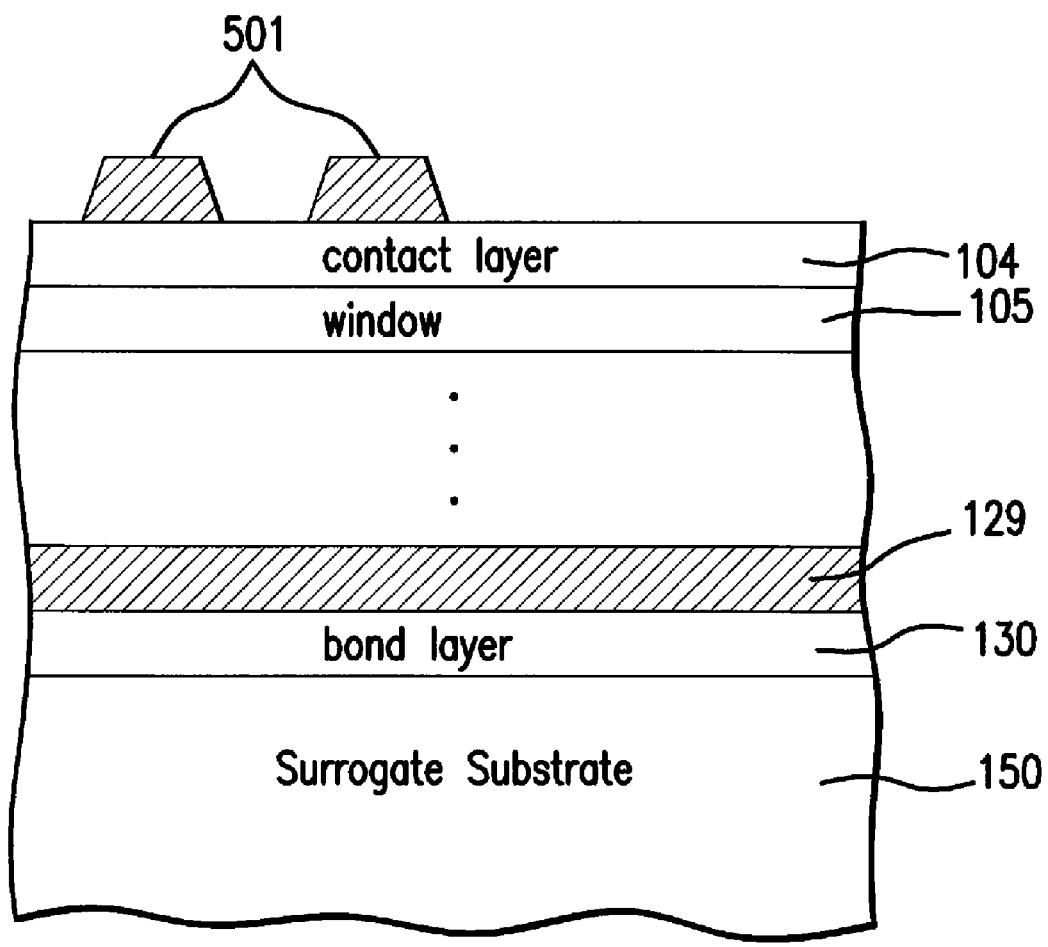
FIG. 16 is a cross-sectional view of the solar cell of FIG. 15 after the next process step in which the grid lines are formed over the contact layer.

FIG. 16 is a cross-sectional view of the solar cell of FIG. 15 after the next sequence of process steps in which a photoresist mask (not shown) is placed over the contact layer 104 to form the grid lines 501. As will be described in greater detail below, the grid lines 501 are deposited via evaporation and lithographically patterned and deposited over the contact layer 104. The mask is subsequently lifted off to form the finished metal grid lines 501 as depicted in subsequent Figures.

As more fully described in U.S. patent application Ser. No. 12/218,582 filed Jul. 18, 2008, hereby incorporated by reference, the grid lines 501 are preferably composed of Pd/Ge/Ti/Pd/Au, although other suitable materials may be used as well.

Figure 17:
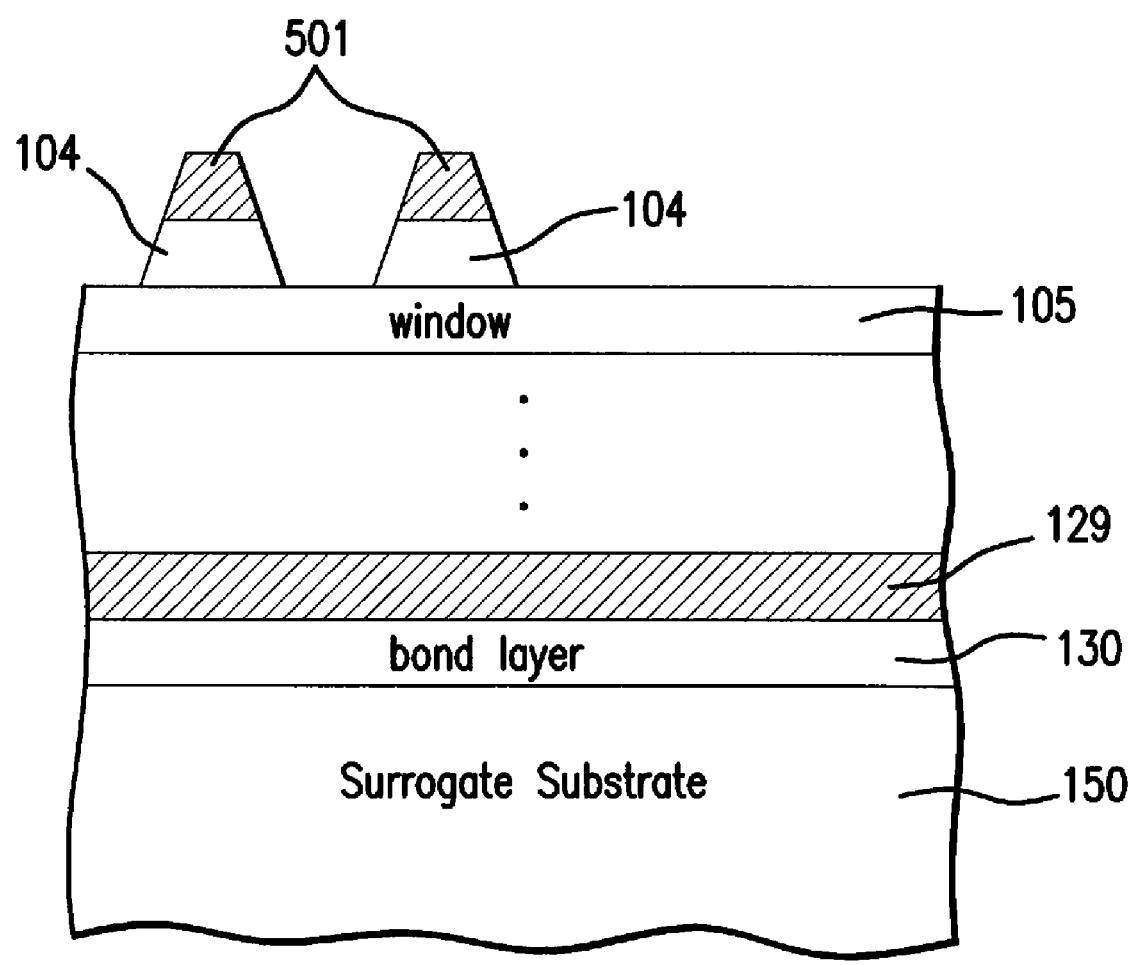
FIG. 17 is a cross-sectional view of the solar cell of FIG. 16 after the next process step.

FIG. 17 is a cross-sectional view of the solar cell of FIG. 16 after the next process step in which the grid lines are used as a mask to etch down the surface to the window layer 105 using a citric acid/peroxide etching mixture.

Figure 18A:
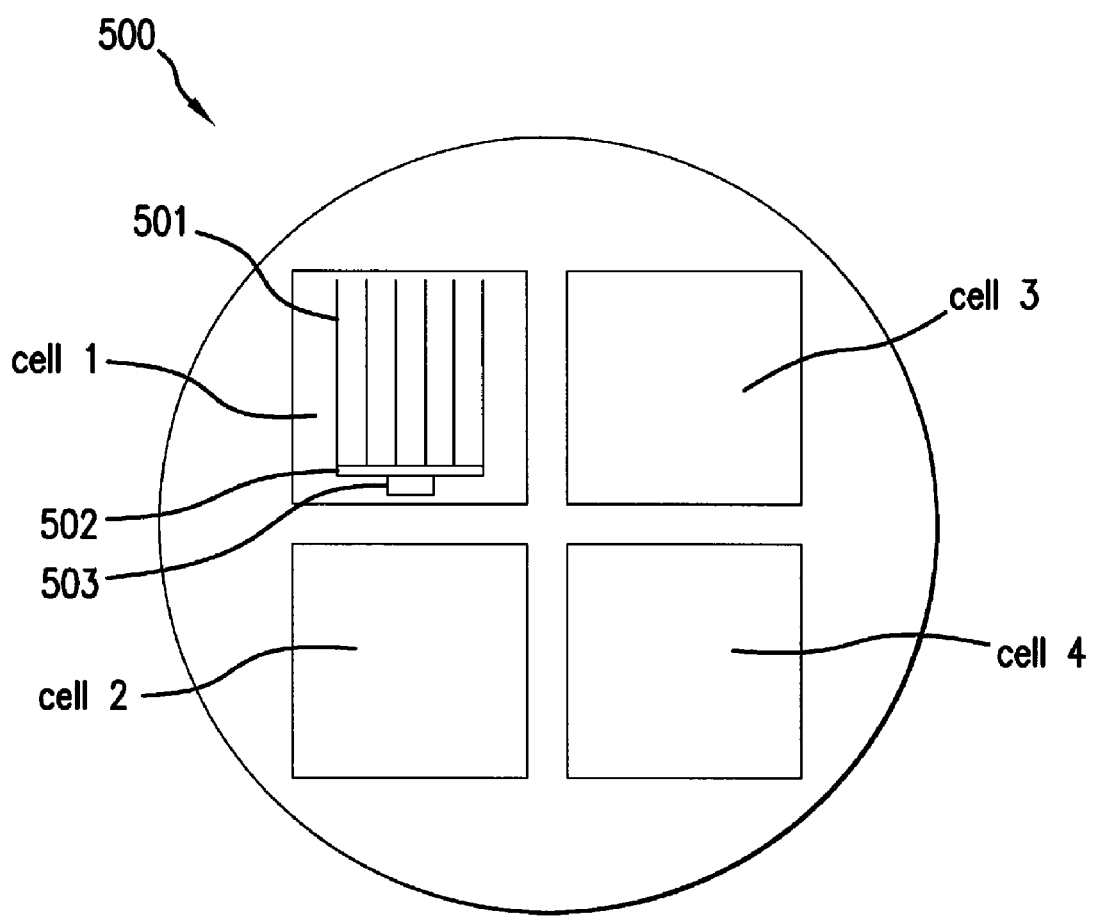
FIG. 18A is a top plan view of a wafer in which four solar cells are fabricated.

FIG. 18A is a top plan view of a wafer in which four solar cells are implemented. The depiction of four cells is for illustration purposes only, and the present invention is not limited to any specific number of cells per wafer.

In each cell there are grid lines 501 (more particularly shown in cross-section in FIG. 17), an interconnecting bus line 502, and a contact pad 503. The geometry and number of grid and bus lines and the contact pad are illustrative and the present invention is not limited to the illustrated embodiment.

Figure 18B:
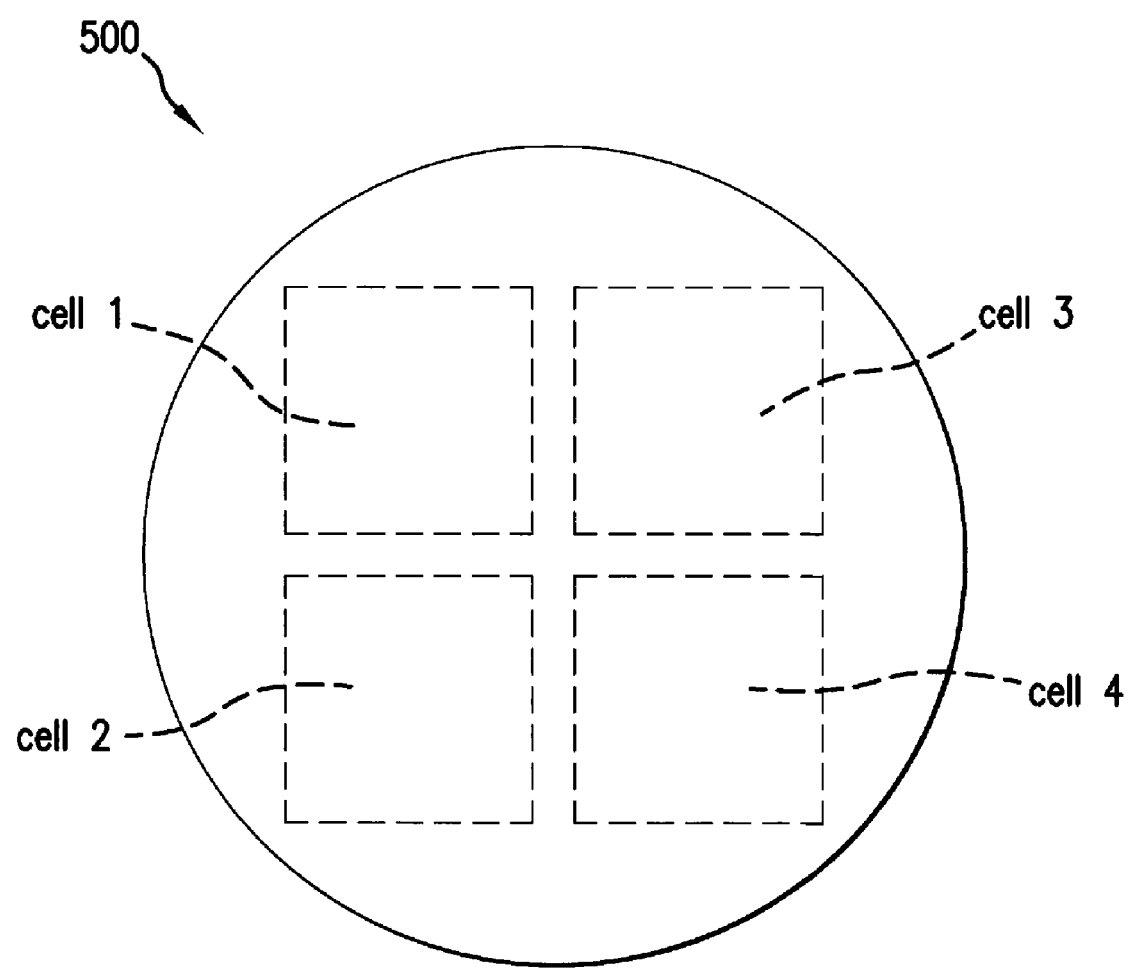
FIG. 18B is a bottom plan view of a wafer of FIG. 18A.

FIG. 18B is a bottom plan view of the wafer with four solar cells shown in FIG. 18A.

Figure 18C:
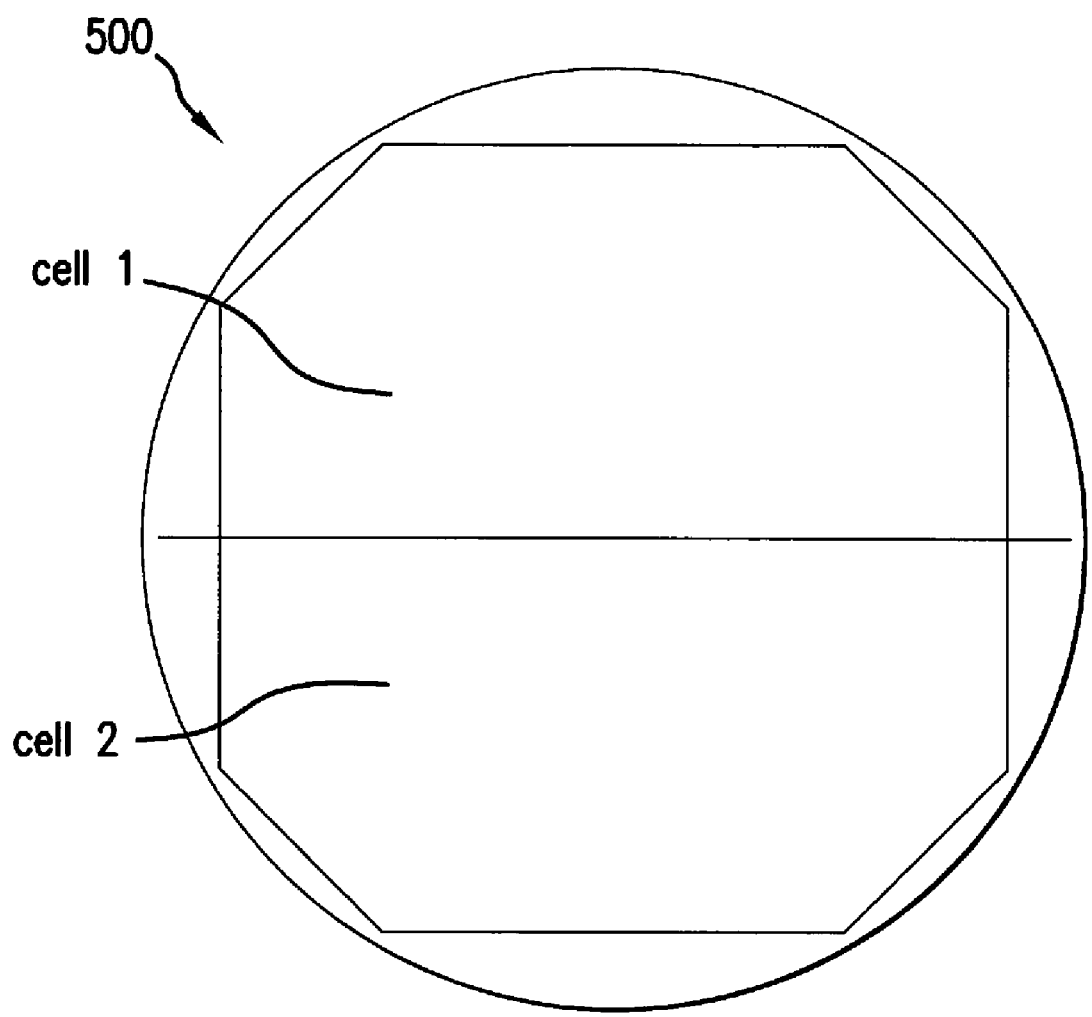
FIG. 18C is a top plan view of a wafer in which two solar cells are fabricated.

FIG. 18C is a top plan view of a wafer in which two solar cells are implemented. The depiction of the two cells in this Figure is for illustration purposes only.

Figure 19:
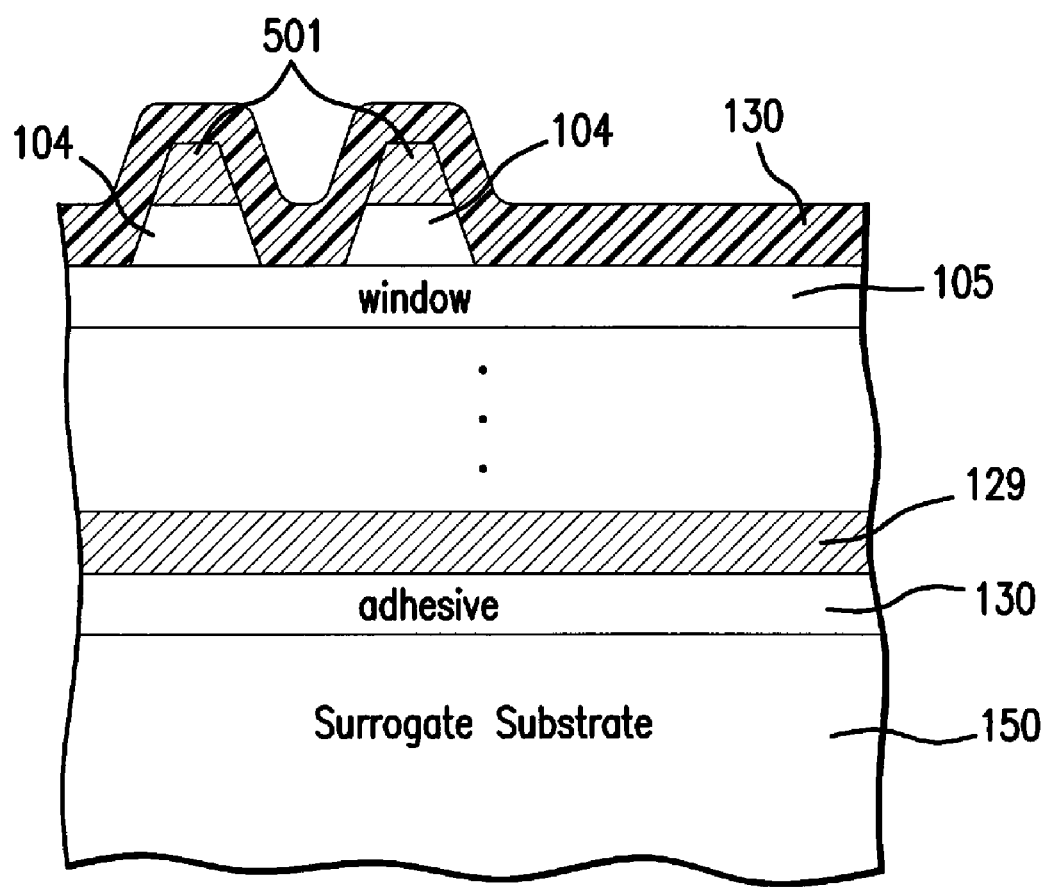
FIG. 19 is a cross-sectional view of the solar cell of FIG. 17 after the next process step.

FIG. 19 is a cross-sectional view of the solar cell of FIG. 17 after the next process step in which an antireflective (ARC) dielectric coating layer 130 is applied over the entire surface of the "bottom" side of the wafer with the grid lines 501.

Figure 20A:
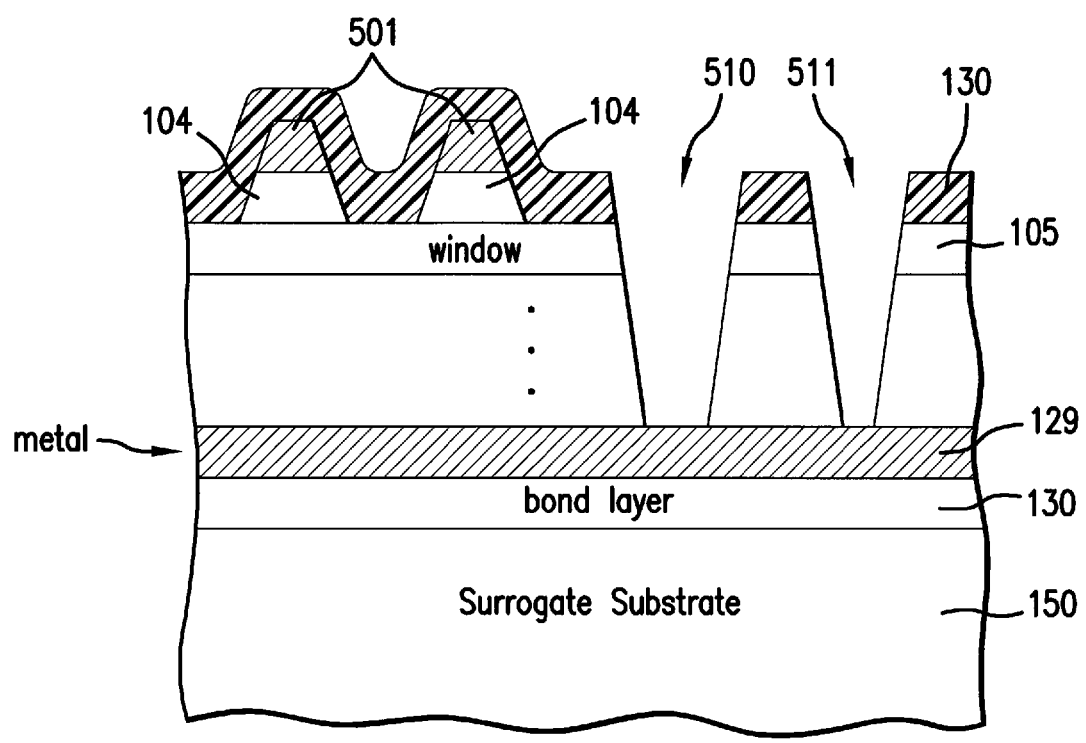
FIG. 20A is a cross-sectional view of the solar cell of FIG. 19 after the next process step.

FIG. 20A is a cross-sectional view of the solar cell of FIG. 19 after the next process step according to the present invention in which first and second annular channels 510 and 511, or portion of the semiconductor structure are etched down to the metal layer 129 using phosphide and arsenide etchants. These channels define a peripheral boundary between the cell and the rest of the wafer, and leave a mesa structure which constitutes the solar cell. The cross-section depicted in FIG. 20A is that as seen from the A-A plane shown in FIG. 21. In a preferred embodiment, channel 510 is substantially wider than that of channel 511.

Figure 20B:
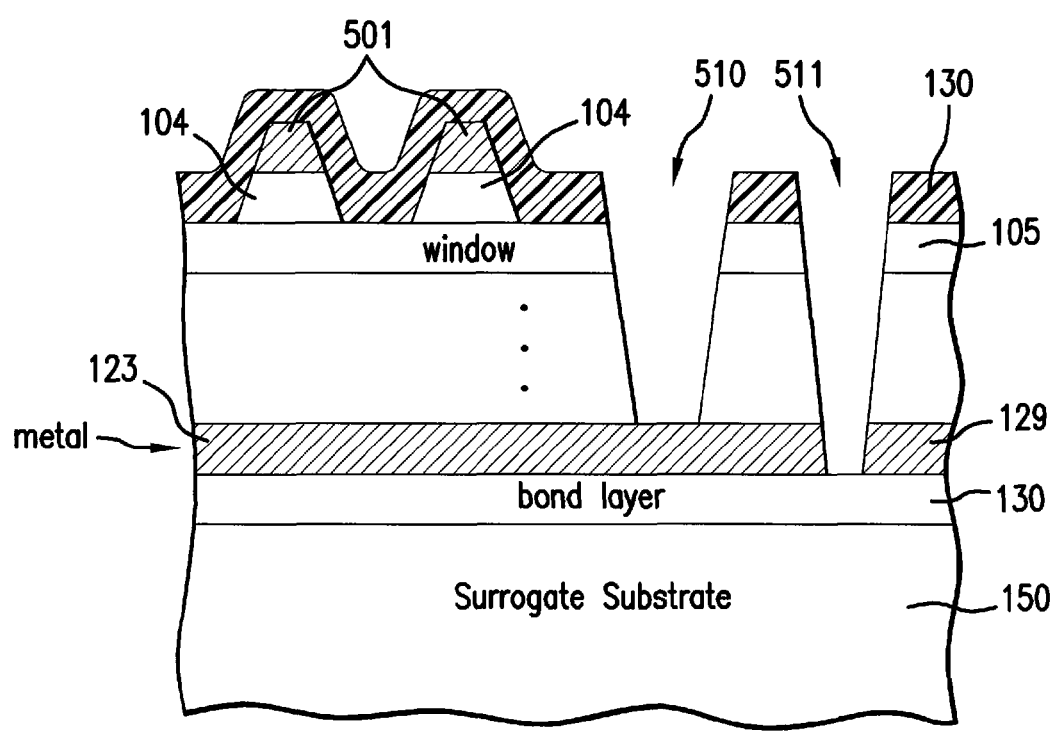
FIG. 20B is a cross-sectional view of the solar cell of FIG. 20A after the next process step.

FIG. 20B is a cross-sectional view of the solar cell of FIG. 20A after the next process step in which channel 511 is exposed to a metal etchant, layer 123 in the channel 511 is removed, and channel 511 is extended in depth approximately to the top surface of the bond or adhesive layer 130.

Figure 21:
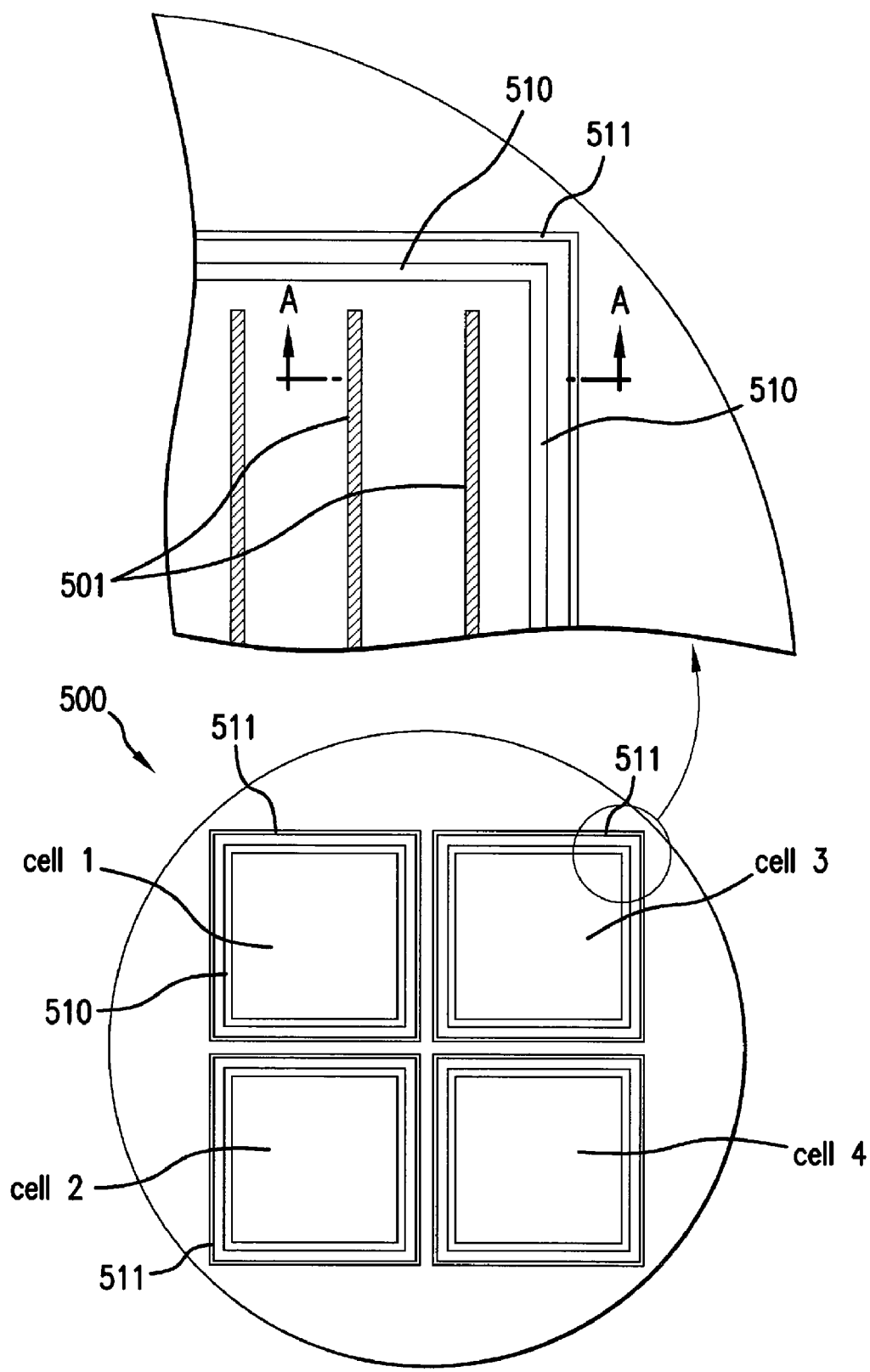
FIG. 21 is a top plan view of the wafer of FIG. 20B depicting the surface view of the trench etched around the cell.

FIG. 21 is a top plan view of the wafer of FIGS. 20A and 20B depicting the channels 510 and 511 etched around the periphery of each cell.

Figure 22A:
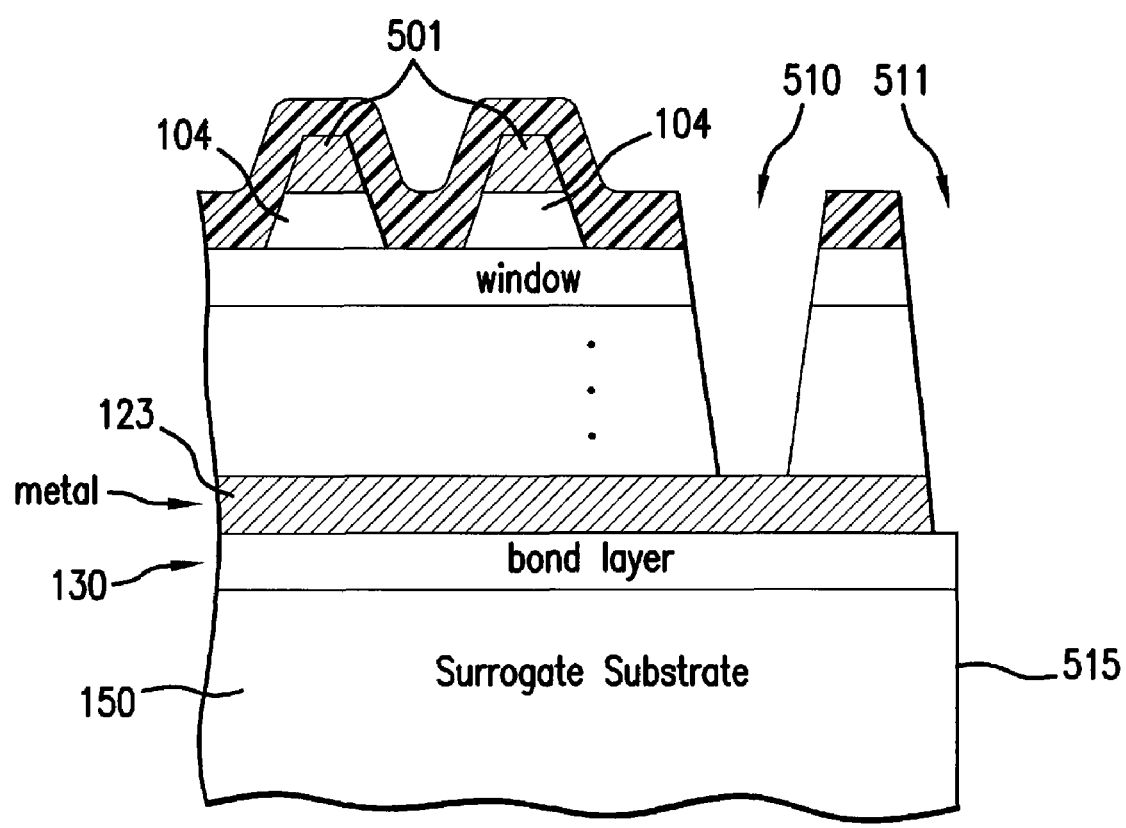
FIG. 22A is a cross-sectional view of the solar cell of FIG. 20B after the next process step in a first embodiment of the present invention.

FIG. 22A is a cross-sectional view of the solar cell of FIG. 20B after the individual solar cells (cell 1, cell 2, etc. shown in FIG. 21) are cut or scribed from the wafer through the channel 511, leaving a vertical edge 515 extending through the surrogate substrate 150 at the location of the channel 511. In this first embodiment of the present invention, the surrogate substrate 150 forms the support for the solar cell in applications where a cover glass (such as provided in the third embodiment to be described below) is not required. In such an embodiment, electrical contact to the metal contact layer 129 may be made through the channel 510.

Figure 22B:
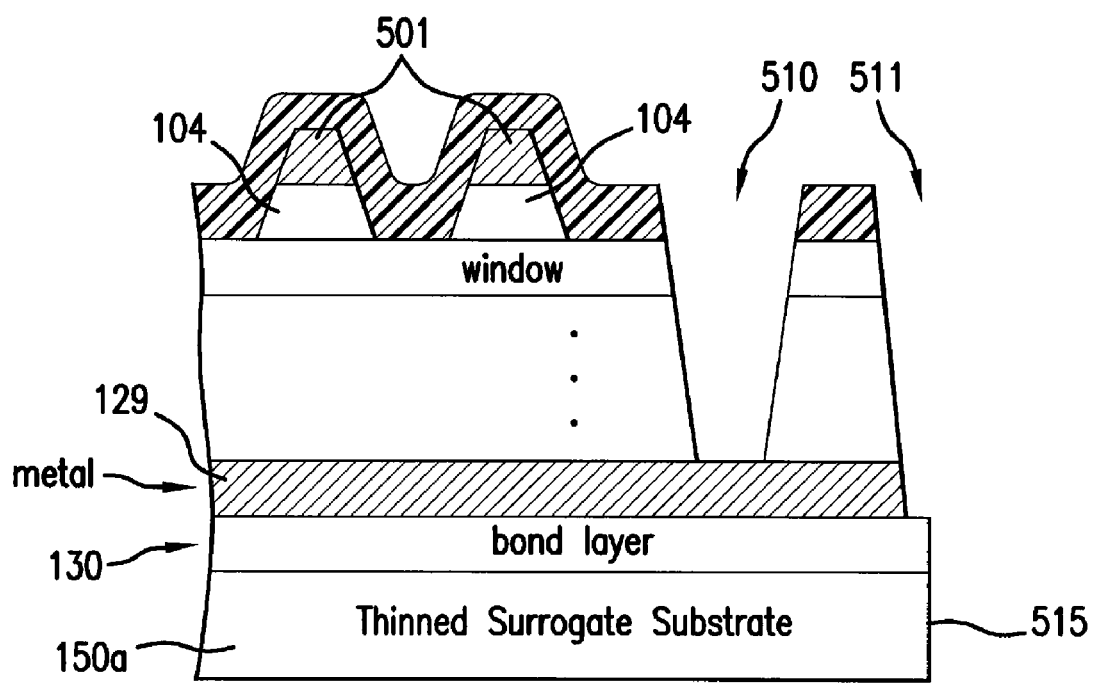
FIG. 22B is a cross-sectional view of the solar cell of FIG. 22A after the next process step in a second embodiment of the present invention.

FIG. 22B is a cross-sectional view of the solar cell of FIG. 22A after the next process step in a second embodiment of the present invention in which the surrogate substrate 150 is appropriately thinned to a relatively thin layer 150a, by grinding, lapping, or etching. In this embodiment, the thin layer 150a forms the support for the solar cell in applications where a cover glass, such as provided in the second embodiment to be described below, is not required. In such an embodiment, electrical contact to the metal contact layer 129 may be made through the channel 510.

Figure 22C:
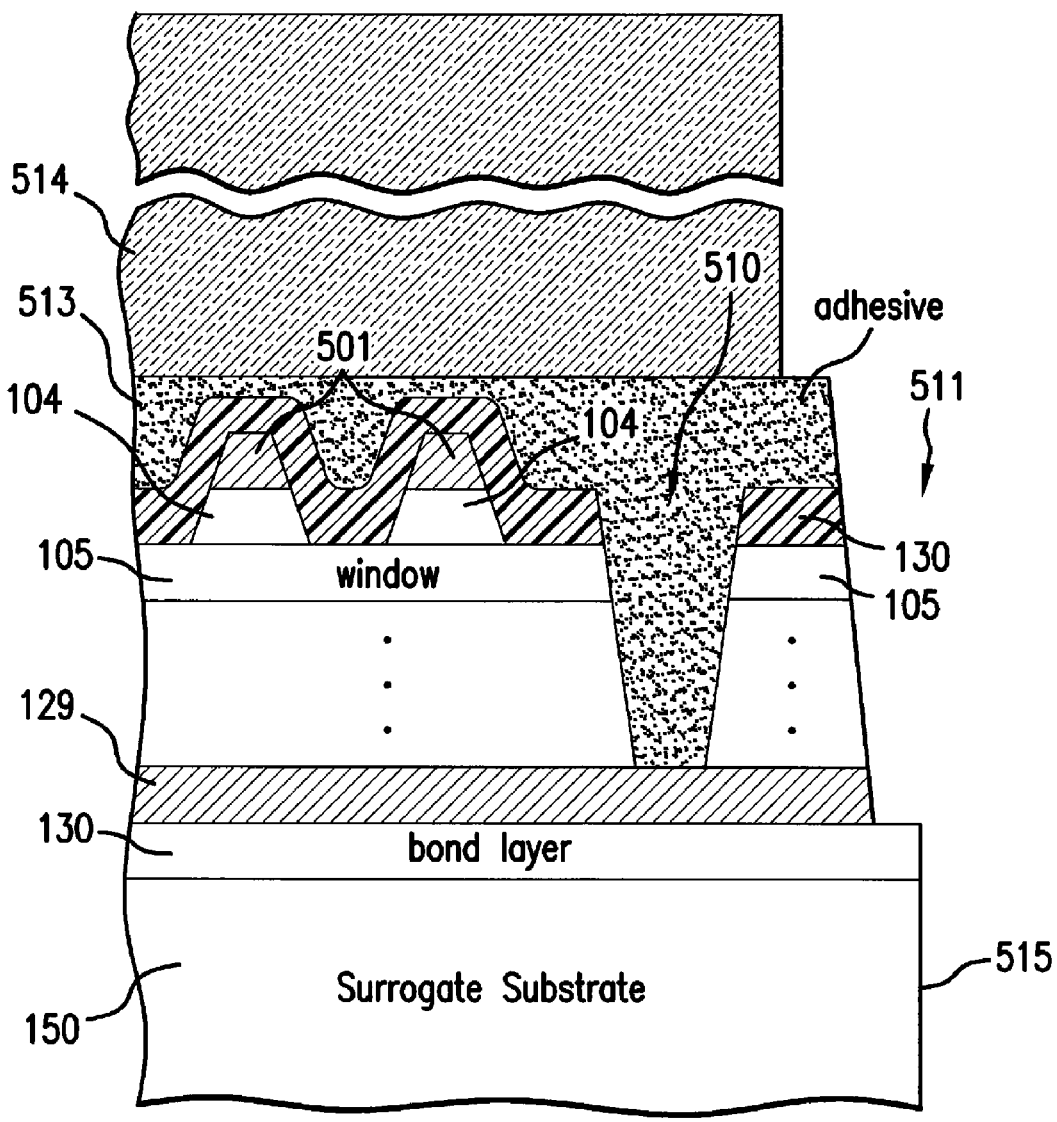
FIG. 22C is a cross-sectional view of the solar cell of FIG. 22A after the next process step in a third embodiment of the present invention in which a cover glass is attached.

FIG. 22C is a cross-sectional view of the solar cell of FIG. 22A after the next process step in a second embodiment of the present invention in which a cover glass 514 is secured to the top of the cell by an adhesive 513. The cover glass 514 preferably covers the entire channel 510, but does not extend to channel 511. Although the use of a cover glass is the preferred embodiment, it is not necessary for all implementations, and additional layers or structures may also be utilized for providing additional support or environmental protection to the solar cell.

Figure 23:
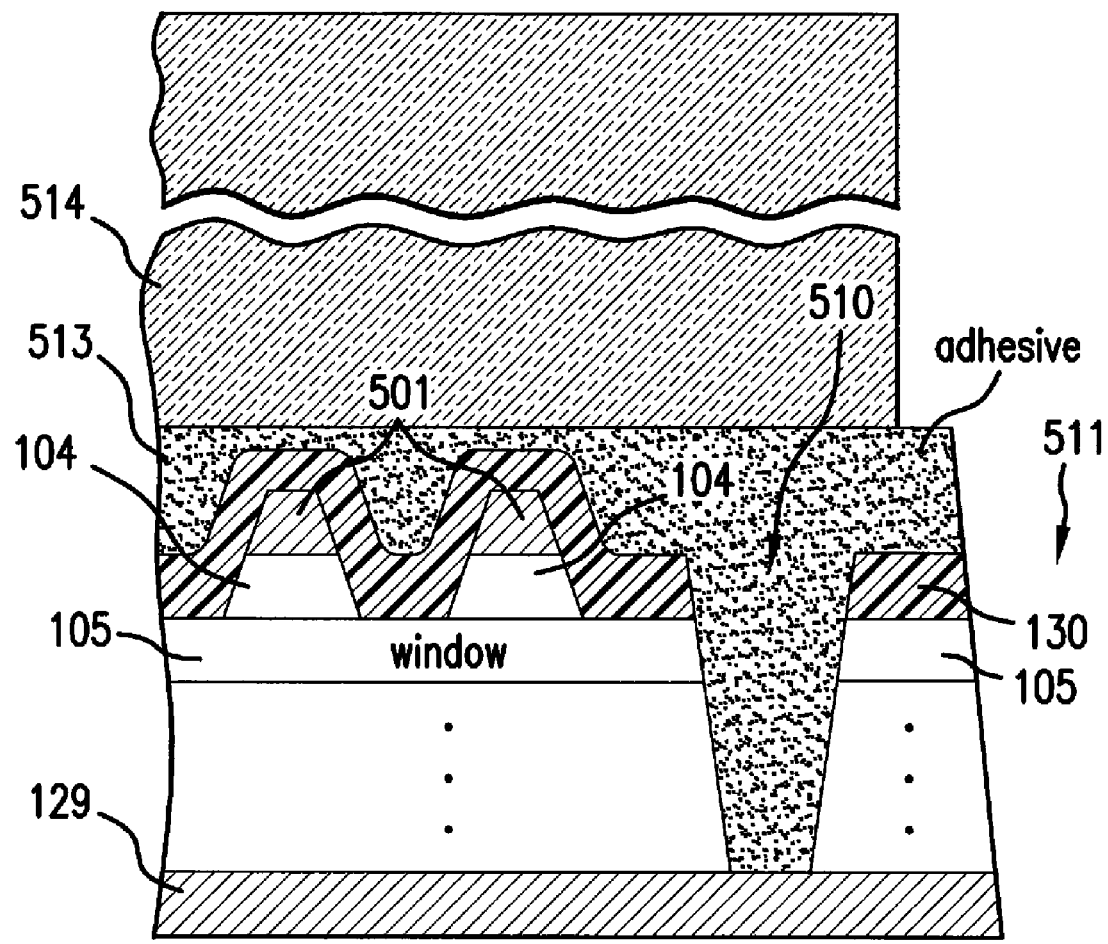
FIG. 23 is a cross-sectional view of the solar cell of FIG. 22C after the next process step in a third embodiment of the present invention in which the surrogate substrate is removed.

FIG. 23 is a cross-sectional view of the solar cell of FIG. 22A after the next process step of the present invention in which the bond or adhesive layer 130, the surrogate substrate 150 and the peripheral portion 512 of the wafer is entirely removed, leaving only the solar cell with the cover glass 514 (or other layers or structures) on the top, and the metal contact layer 129 on the bottom, which forms the backside contact of the solar cell. The surrogate substrate 150 is preferably removed by the use of the etchant 'Wafer Bond Solvent'. As noted above, the surrogate substrate includes perforations over its surface that allow the flow of etchant through the surrogate substrate 150 to permit its lift off. After lift off, the surrogate substrate may be reused in subsequent wafer processing operations.

Figure 24:
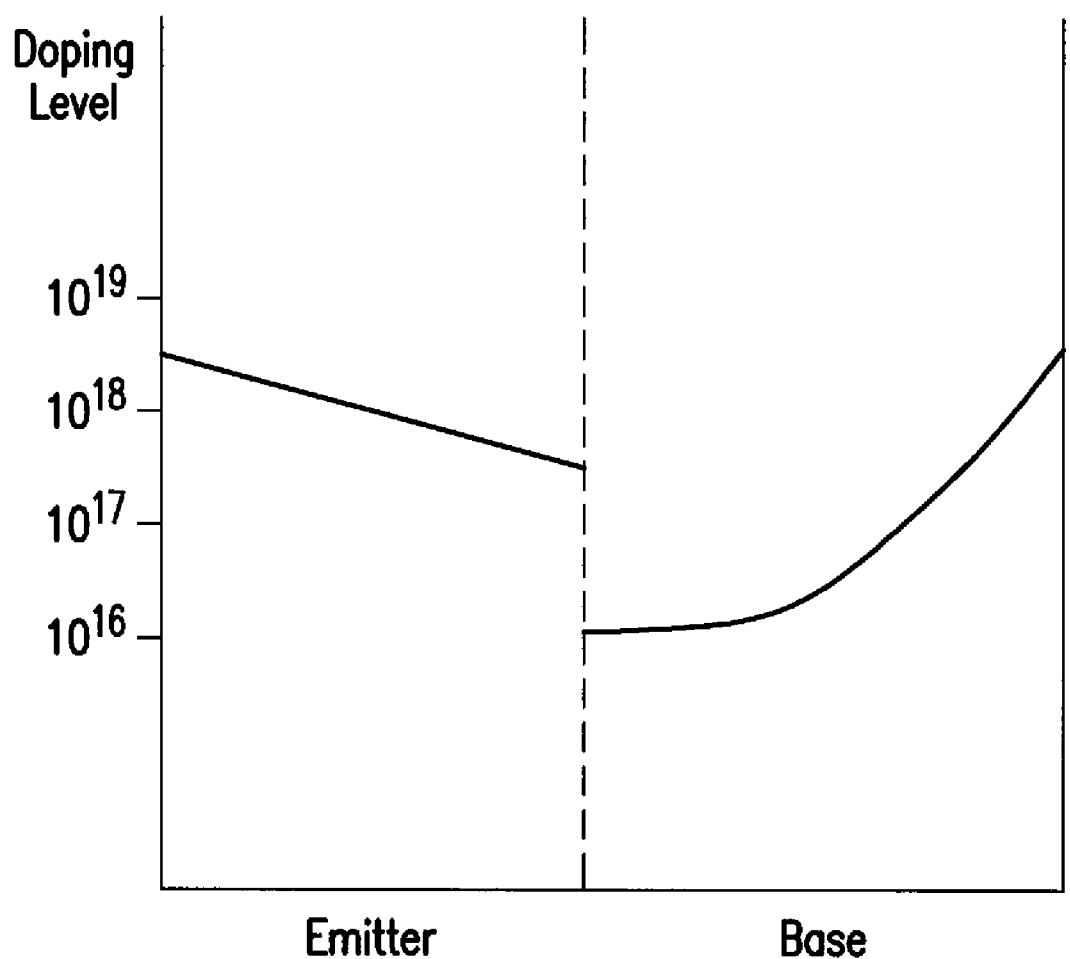
FIG. 24 is a graph of the doping profile in a base and adjoining emitter layer in the metamorphic solar cell according to the present invention.

FIG. 24 is a graph of a doping profile in the emitter and base layers in one or more subcells of the inverted metamorphic multijunction solar cell of the present invention. The various doping profiles within the scope of the present invention, and the advantages of such doping profiles are more particularly described in copending U.S. patent application Ser. No. 11/956,069 filed Dec. 13, 2007, herein incorporated by reference. The doping profiles depicted herein are merely illustrative, and other more complex profiles may be utilized as would be apparent to those skilled in the art without departing from the scope of the present invention.

It should be apparent to one skilled in the art, that additional layer(s) may be added or deleted in the cell structure of FIG. 13B without departing from the scope of the present invention.

It will be understood that each of the elements described above, or two or more together, also may find a useful application in other types of constructions differing from the types of constructions described above.

Although the preferred embodiment of the present invention utilizes a vertical stack of four subcells, the present invention can apply to stacks with fewer or greater number of subcells, i.e. two junction cells, three junction cells, five junction cells, etc. as more particularly described in U.S. patent application Ser. No. 12/267,812 filed Nov. 10, 2008. In the case of four or more junction cells, the use of more than one metamorphic grading interlayer may also be utilized, as more particularly described in U.S. patent application Ser. No. 12/271,192 filed Nov. 14, 2008.

In addition, although the present embodiment is configured with top and bottom electrical contacts, the subcells may alternatively be contacted by means of metal contacts to laterally conductive semiconductor layers between the subcells. Such arrangements may be used to form 3-terminal, 4-terminal, and in general, n-terminal devices. The subcells can be interconnected in circuits using these additional terminals such that most of the available photogenerated current density in each subcell can be used effectively, leading to high efficiency for the multijunction cell, notwithstanding that the photogenerated current densities are typically different in the various subcells.

As noted above, the present invention may utilize an arrangement of one or more, or all, homojunction cells or subcells, i.e., a cell or subcell in which the p-n junction is formed between a p-type semiconductor and an n-type semiconductor both of which have the same chemical composition and the same band gap, differing only in the dopant species and types, and one or more heterojunction cells or subcells. Subcell A, with p-type and n-type InGaP is one example of a homojunction subcell. Alternatively, as more particularly described in U.S. patent application Ser. No. 12/023,772 filed Jan. 31, 2008, the present invention may utilize one or more, or all, heterojunction cells or subcells, i.e., a cell or subcell in which the p-n junction is formed between a p-type semiconductor and an n-type semiconductor having different chemical compositions of the semiconductor material in the n-type regions, and/or different band gap energies in the p-type regions, in addition to utilizing different dopant species and type in the p-type and n-type regions that form the p-n junction.

In some cells, a thin so-called "intrinsic layer" may be placed between the emitter layer and base layer, with the same or different composition from either the emitter layer or the base layer. The intrinsic layer functions to suppress minority-carrier recombination in the space-charge region. Similarly, either the base layer or the emitter layer may also be intrinsic or not-intentionally-doped ("ND") over part or all of its thickness.

The composition of the window or BSF layers may utilize other semiconductor compounds, subject to lattice constant and band gap requirements, and may include AlInP, AlAs, AlP, AlGaInP, AlGaAsP, AlGaInAs, AlGaInPAs, GaInP, GaInAs, GaInPAs, AlGaAs, AlInAs, AlInPAs, GaAsSb, AlAsSb, GaAlAsSb, AlInSb, GaInSb, AlGaInSb, AlN, GaN, InN, GaInN, AlGaInN, GaInNAs, AlGaInNAs, ZnSSe, CdSSe, and similar materials, and still fall within the spirit of the present invention.

While the invention has been illustrated and described as embodied in a inverted metamorphic multijunction solar cell, it is not intended to be limited to the details shown, since various modifications and structural changes may be made without departing in any way from the spirit of the present invention.

Thus, while the description of this invention has focused primarily on solar cells or photovoltaic devices, persons skilled in the art know that other electronic and optoelectronic devices, such as, transistors, thermophotovoltaic (TPV) cells, photodetectors and light-emitting diodes (LEDS) are very similar in structure, physics, and materials to photovoltaic devices with some minor variations in doping and the minority carrier lifetime. For example, photodetectors can be the same materials and structures as the photovoltaic devices described above, but perhaps more lightly-doped for sensitivity rather than power production. On the other hand LEDs and also be made with similar structures and materials, but perhaps more heavily-doped to shorten recombination time, thus radiative lifetime to produce light instead of power. Therefore, this invention also applies to photodetectors and LEDs with structures, compositions of matter, articles of manufacture, and improvements as described above for photovoltaic cells.

Without further analysis, from the foregoing others can, by applying current knowledge, readily adapt the present invention for various applications. Such adaptations should and are intended to be comprehended within the meaning and range of equivalence of the following claims.

The invention claimed is:

1. A method of manufacturing a solar cell, comprising:
   providing a semiconductor carrier with a prepared bonding surface;
   providing a support substrate;
   bonding the semiconductor carrier and the support substrate to produce a composite structure;
   detaching the bulk of the semiconductor carrier from the composite structure, leaving a semiconductor growth substrate on the support substrate;
   depositing a sequence of layers of semiconductor material forming a solar cell on the semiconductor growth substrate;
   mounting a surrogate second substrate on top of the sequence of layers of semiconductor material forming the solar cell; and
   removing the semiconductor growth substrate and leaving the sequence of layers of semiconductor material forming the solar cell.

2. The method of claim 1, wherein the semiconductor growth substrate is gallium arsenide or germanium.

3. The method of claim 1, wherein bonding the semiconductor carrier and the support substrate to produce the composite structure comprises molecularly bonding the prepared bonding surface of the semiconductor carrier directly to a surface of the support substrate.

4. The method of claim 1, wherein detaching the bulk of the semiconductor carrier from the composite structure comprises:
   implanting a species into the semiconductor carrier to form a defect layer in the semiconductor carrier;
   bonding the defect layer of the semiconductor carrier directly to the support substrate to produce the composite structure; and
   detaching the bulk of the semiconductor carrier from the composite structure, leaving the semiconductor growth substrate on the support substrate, the semiconductor growth substrate being relatively thin.

5. The method of claim 4, wherein detaching the bulk of the semiconductor carrier from the composite structure comprises:
   annealing the composite structure at an elevated temperature to weaken the semiconductor carrier at the defect layer; and
   detaching the bulk of the semiconductor carrier from the composite structure along the defect layer after or during annealing of the composite structure.

6. The method of claim 1, wherein the thickness of the semiconductor substrate is about 5 microns, and the thickness of the bulk of the semiconductor carrier detached from the composite structure is in excess of 350 microns.

7. The method of claim 1, further comprising roughening the prepared bonding surface of the semiconductor carrier prior to bonding the carrier and the support substrate.

8. The method of claim 1, further comprising:
   (i) preparing a new bonding surface on the detached bulk portion of the semiconductor carrier to form a new semiconductor carrier;
   (ii) providing a new support substrate;
   (iii) bonding the new semiconductor carrier and the new support substrate to produce a new composite structure;
   (iv) detaching the bulk of the new semiconductor carrier from the new composite structure, leaving a new semiconductor substrate on the new support substrate; and
   (v) depositing a sequence of layers of semiconductor material forming a solar cell on the new semiconductor substrate; and
   (vi) repeating steps (i) through (v) with the detached bulk portion of the new semiconductor carrier.

9. A method as defined in claim 1, wherein the support substrate is sapphire or sapphire/spinel.

10. A method as defined in claim 2, wherein the step of depositing a sequence of layers on the gallium arsenide growth substrate comprises:
    forming an upper first solar subcell having a first band gap on said gallium arsenide growth substrate;
    forming a middle second solar subcell over said first solar subcell having a second band gap smaller than said first band gap;
    forming a graded interlayer over said second solar subcell;
    forming a third solar subcell over said graded interlayer having a fourth band gap smaller than said second band gap such that said third subcell is lattice mismatched with respect to said second subcell.

11. The method as defined in claim 10, further comprising forming a lower fourth solar subcell over said third subcell having a fifth band gap smaller than said fourth band gap such that said fourth subcell is lattice matched with respect to said third subcell.

12. The method as defined in claim 10, wherein the upper subcell is composed of InGa(Al)P, the second subcell is composed of an GaAs, GaInP, GaInAs, GaAsSb, or GaInAsN emitter region and a GaAs, GaInAs, GaAsSb, or GaInAsN base region, and the third subcell is composed of a GaInAsP base and emitter.

13. The method as defined in claim 11, wherein the fourth subcell is composed of GaInAs base and emitter layers.

14. The method as defined in claim 10, wherein the graded interlayer is compositionally graded to lattice match the second subcell on one side and the third subcell on the other side and is composed of $(In_xGa_{1-x})_yAl_{1-y}As$ with x and y selected such that the band gap of the graded interlayer remains constant throughout its thickness.

15. A method as defined in claim 1, wherein the semiconductor carrier is gallium arsenide that is off-cut from the (001) crystal plane by at least 6° towards the (111)A plane.

16. A method as defined in claim 1, further comprising removing the surrogate second substrate and leaving the sequence of layers of semiconductor material forming the solar cell.

* * * * *

UNITED STATES PATENT AND TRADEMARK OFFICE
CERTIFICATE OF CORRECTION

| | | |
|---|---|---|
| PATENT NO. | : 7,785,989 B2 | Page 1 of 1 |
| APPLICATION NO. | : 12/337014 | |
| DATED | : August 31, 2010 | |
| INVENTOR(S) | : Sharps et al. | |

It is certified that error appears in the above-identified patent and that said Letters Patent is hereby corrected as shown below:

Column 1, line 38, change "Aug. 8, 2007" to --Aug. 9, 2007--.
Column 6, line 11, change "relative" to --relatively--.
Column 10, line 10, change "(T)" to --(TI)--.
Column 12, line 46, change "another" to --other--.
Column 13, line 5, change "another" to --other--.
Column 14, line 7, change "Jul. 18, 2008" to --Jul. 16, 2008--.

Signed and Sealed this
Eighteenth Day of January, 2011

David J. Kappos
*Director of the United States Patent and Trademark Office*